United States Patent
Kim et al.

(10) Patent No.: US 11,909,313 B2
(45) Date of Patent: Feb. 20, 2024

(54) VOLTAGE CONVERTER, STORAGE DEVICE INCLUDING VOLTAGE CONVERTER, AND OPERATING METHOD OF VOLTAGE CONVERTER

(71) Applicant: Samsung Electronics Co., Ltd., Suwon-si (KR)

(72) Inventors: Jaekyu Kim, Yongin-si (KR); Jeonghyeon Kim, Suwon-si (KR); Jehyung Yoon, Seoul (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 319 days.

(21) Appl. No.: 17/346,769

(22) Filed: Jun. 14, 2021

(65) Prior Publication Data

US 2022/0140728 A1    May 5, 2022

(30) Foreign Application Priority Data

Nov. 2, 2020 (KR) .................. 10-2020-0144168

(51) Int. Cl.
*G11C 5/14* (2006.01)
*H02M 1/00* (2006.01)
*H02M 1/08* (2006.01)
*H02M 1/38* (2007.01)
*H02M 3/157* (2006.01)
*H02M 3/158* (2006.01)

(52) U.S. Cl.
CPC .............. *H02M 3/158* (2013.01); *G11C 5/147* (2013.01); *H02M 1/0009* (2021.05); *H02M 1/083* (2013.01); *H02M 1/38* (2013.01); *H02M 3/157* (2013.01)

(58) Field of Classification Search
CPC ..... G11C 5/147; H02M 3/158; H02M 1/0009; H02M 1/083; H02M 1/38; H02M 3/157
USPC ............................................. 365/226
See application file for complete search history.

(56) References Cited

U.S. PATENT DOCUMENTS

| 6,411,068 | B1 * | 6/2002 | Willis ............... H02M 3/1563 323/282 |
| 8,471,540 | B2 | 6/2013 | Yamada |
| 8,698,470 | B2 | 4/2014 | Ju |
| 8,957,661 | B2 | 2/2015 | Heo et al. |
| 9,030,177 | B2 * | 5/2015 | Nakashima ......... H02M 3/1588 323/285 |
| 9,489,001 | B2 | 11/2016 | Wang |
| 9,595,866 | B2 * | 3/2017 | Choi .................... H02M 3/156 |

(Continued)

FOREIGN PATENT DOCUMENTS

| KR | 101065632 B1 | 9/2011 |
| KR | 101087689 B1 | 11/2011 |
| KR | 10-2018-0093729 A | 8/2018 |

*Primary Examiner* — Ly D Pham
(74) *Attorney, Agent, or Firm* — Harness, Dickey & Pierce, P.L.C.

(57) ABSTRACT

An operating method of a voltage converter, includes converting an input voltage to an output voltage and providing a load current corresponding to the output voltage in a pulse frequency modulation mode or a pulse width modulation mode, entering the pulse frequency modulation mode in response to an amount of the load current being less than or equal to a first threshold value, and entering the pulse width modulation mode in response to the amount of the load current being greater than a second threshold value.

20 Claims, 16 Drawing Sheets

(56) References Cited

U.S. PATENT DOCUMENTS

| | | | |
|---|---|---|---|
| 2010/0134085 A1* | 6/2010 | Nishida | H02M 3/1563 |
| | | | 323/285 |
| 2012/0281447 A1* | 11/2012 | Heo | H02M 3/1588 |
| | | | 363/74 |
| 2016/0329734 A1* | 11/2016 | Lee | H02M 3/156 |
| 2018/0034365 A1* | 2/2018 | Sicard | H02M 3/158 |
| 2020/0136510 A1* | 4/2020 | Nam | H02M 3/158 |

* cited by examiner

VOLTAGE CONVERTER, STORAGE DEVICE INCLUDING VOLTAGE CONVERTER, AND OPERATING METHOD OF VOLTAGE CONVERTER

CROSS-REFERENCE TO RELATED APPLICATIONS

This application claims priority under 35 U.S.C. § 119 to Korean Patent Application No. 10-2020-0144168 filed on Nov. 2, 2020, in the Korean Intellectual Property Office, the disclosures of which are incorporated by reference herein in their entireties.

BACKGROUND

Embodiments of the present disclosure described herein relate to electronic devices, and more particularly, relate to voltage converters having improved power efficiency, storage devices including the voltage converter, and operating methods of the voltage converter.

Electronic devices may operate based on power from the outside. For example, an electronic device may convert an external power supply voltage supplied from the outside to an internal power supply voltage necessary for components therein and may use the internal power supply voltage. A required voltage converter may change depending on a kind of the electronic device.

For example, an electronic device that uses an internal power supply voltage greater than an external power supply voltage may require a boost converter as a voltage converter. An electronic device that uses an internal power supply voltage smaller than an external power supply voltage may require a buck converter as a voltage converter.

An efficient switching manner of the buck converter or the boost converter may change depending on a difference between a level of an external power supply voltage and a level of an internal power supply voltage. Accordingly, there is required a voltage converter adaptively coping with various peripheral environments.

SUMMARY

Example embodiments of the present disclosure provide voltage converter shaving improved power efficiency, storage devices including the voltage converter, and operating methods of the voltage converter.

According to some example embodiments, an operating method of a voltage converter includes converting an input voltage to an output voltage and providing a load current corresponding to the output voltage in a pulse frequency modulation mode or a pulse width modulation mode, entering the pulse frequency modulation mode in response to an amount of the load current being less than or equal to a first threshold value, and entering the pulse width modulation mode in response to the amount of the load current being greater than a second threshold value.

According to some example embodiments, a voltage converter includes a first transistor connected between an input node and a switch node, a second transistors connected between the switch node and a ground node, an inductor connected between the switch node and an output node, a capacitor connected between the output node and the ground node, resistors connected with the output node, and configured to divide an output voltage of the output node to generate a feedback voltage, a comparator to compare the feedback voltage and a reference voltage to output a comparison signal, a mode control circuit to output a mode signal of a first level based on an amount of a load current supplied through the output node being less than or equal to a threshold and to output the mode signal of a second level based on the amount of the load current being greater than the threshold, a control logic circuit to generate a first control signal and a second control signal based on pulse frequency modulation based on the mode signal being at the first level and to generate the first control signal and the second control signal based on pulse width modulation based on the mode signal being at the second level, and a gate driver to control the first transistor and the second transistor in response to the first control signal and the second control signal.

According to some example embodiments, a storage device includes a nonvolatile memory device, a controller to control the nonvolatile memory device, and a power management integrated circuit to supply an output voltage to the nonvolatile memory device and the controller. The power management integrated circuit includes a first transistor connected between an input node and a switch node, a second transistor connected between the switch node and a ground node, an inductor connected between the switch node and an output node from which the output voltage is output, a capacitor connected between the output node and the ground node, resistors connected with the output node, and configured to divide the output voltage to generate a feedback voltage, a mode control circuit to output a mode signal of a first level based on an amount of a load current supplied through the output node being greater than a threshold and to output the mode signal of a second level based on the amount of the load current being less than or equal to the threshold, a control logic circuit to generate a first control signal and a second control signal based on pulse frequency modulation based on the mode signal being at the first level and to generate the first control signal and the second control signal based on pulse width modulation based on the mode signal being at the second level, and a gate driver to control the first transistor and the second transistor in response to the first control signal and the second control signal.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure may be described in detail and clearly to such an extent that one skilled in the art easily implements the present disclosure.

Figure 1:
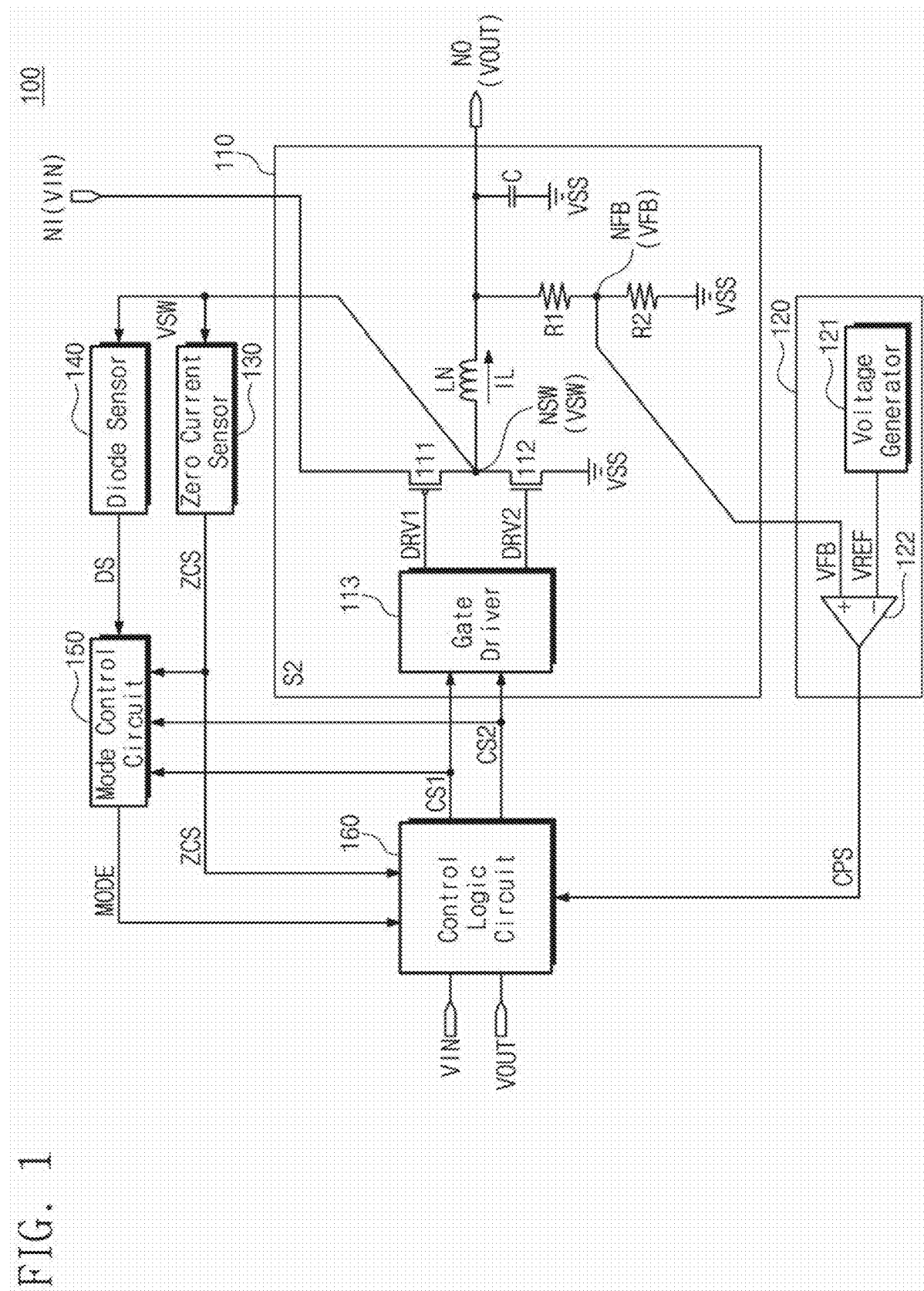
FIG. 1 illustrates a voltage converter according to some example embodiments of the present disclosure.

FIG. 1 illustrates a voltage converter 100 according to some example embodiments of the present disclosure. Referring to FIG. 1, the voltage converter 100 may include a buck converter circuit 110, a comparison circuit 120, a zero current sensor 130, a diode sensor 140, a mode control circuit 150, and a control logic circuit 160.

The buck converter circuit 110 may receive an input voltage VIN from an input node NI. The buck converter circuit 110 may convert the input voltage VIN and may output the converted voltage to an output node NO as an output voltage VOUT. For example, the buck converter circuit 110 may step down the input voltage VIN and may output the stepped-down voltage as the output voltage VOUT.

The buck converter circuit 110 may include a first power transistor 111, a second power transistor 112, a gate driver 113, an inductor LN, a capacitor "C", a first resistor R1, and a second resistor R2.

The first power transistor 111 may be connected between (e.g., directly connected between) the input node NI and a switch node NSW. The first power transistor 111 may be a PMOS transistor. The first power transistor 111 may operate in response to a first drive signal DRV1 output from the gate driver 113.

The second power transistor 112 may be connected between (e.g., directly connected between) the switch node NSW and a ground node to which a ground voltage VSS is supplied. The second power transistor 112 may be an NMOS transistor. The second power transistor 112 may operate in response to a second drive signal DRV2 output from the gate driver 113.

The gate driver 113 may receive a first control signal CS1 and a second control signal CS2 from the control logic circuit 160. The gate driver 113 may generate the first drive signal DRV1 and the second drive signal DRV2 based on the first control signal CS1 and the second control signal CS2. The gate driver 113 may respectively apply the first drive signal DRV1 and the second drive signal DRV2 to a gate of the first power transistor 111 and a gate of the second power transistor 112 and thus may control the first power transistor 111 and the second power transistor 112.

In some example embodiments, the gate driver 113 may generate the first drive signal DRV1 so as to follow at least a portion of a waveform of the first control signal CS1. The gate driver 113 may generate the second drive signal DRV2 so as to follow at least a portion of a waveform of the second control signal CS2. The inductor LN may be connected between (e.g., directly connected between) the switch node NSW and the output node NO. A direction from the switch node NSW to the output node NO may be a positive direction of an inductor current IL.

The capacitor "C" may be connected between (e.g., directly connected between) the output node NO and the ground node to which the ground voltage VSS is supplied. The first resistor R1 and the second resistor R2 may be connected between (e.g., directly connected between) the output node NO and the ground node to which the ground voltage VSS is supplied. A voltage of a feedback node NFB between the first resistor R1 and the second resistor R2 may be output as a feedback voltage VFB.

The comparison circuit 120 may include a voltage generator 121 and a comparator 122. The voltage generator 121 may generate a reference voltage VREF. The voltage generator 121 may output the reference voltage VREF thus generated to the comparator 122. For example, the voltage generator 121 may set a level of the reference voltage VREF such that the output voltage VOUT is the same (or, similar, for example, within ±10%) as a target level of the output voltage VOUT when the feedback voltage VFB is the same (or, similar, for example, within ±10%) as the reference voltage VREF.

The comparator 122 may include a positive input (+) of receiving the feedback voltage VFB and a negative input (−) of receiving the reference voltage VREF. The comparator 122 may compare the feedback voltage VFB and the reference voltage VREF to output a comparison signal CPS. For example, when the feedback voltage VFB is not greater (e.g., less than or equal to) than the reference voltage VREF (or approaches to the reference voltage VREF within a preset (e.g., desired) voltage), the comparator 122 may output the comparison signal CPS of a first level (e.g., a low level). When the feedback voltage VFB is greater than the reference voltage VREF, the comparator 122 may output the comparison signal CPS of a second level (e.g., a high level).

The zero current sensor 130 may receive a switch voltage VSW of the switch node NSW of the buck converter circuit 110. In response to the switch voltage VSW, the zero current sensor 130 may detect that no current flows to the switch node NSW. In response to detecting that no current flows to the switch node NSW, the zero current sensor 130 may output a zero current, signal ZCS of the second level (e.g., the high level). When a current flows to the switch node NSW, the zero current sensor 130 may output the zero current signal ZCS of the first level (e.g., the low level).

The diode sensor 140 may receive the switch voltage VSW of the switch node NSW. In response to the switch voltage VSW, the diode sensor 140 may determine whether a load current (e.g., ILOAD) output through the output node NO is not greater (e.g., less than or equal to) than a threshold. When the load current ILOAD is greater than the threshold, the diode sensor 140 may output a detection signal DS of the first level (e.g., the low level). When the load current ILOAD is not greater (e.g., less than or equal to) than the threshold, the diode sensor 140 may output the detection signal DS of the second level (e.g., the high level).

In some example embodiments, the diode sensor 140 may be activated while a specific condition is satisfied. The specific condition at which the diode sensor 140 is activated will be more fully described with reference to FIGS. 13 and 14.

The mode control circuit 150 may receive the zero current signal ZCS from the zero current sensor 130 and may receive the detection signal DS from the diode sensor 140. Also, the mode control circuit 150 may receive the first control signal CS1 and the second control signal CS2 from the control logic circuit 160. The mode control circuit 150 may generate a mode signal MODE based on the zero current signal ZCS, the detection signal DS, the first control signal CS1, and the second control signal CS2.

In some example embodiments, in response to the detection signal DS being deactivated (e.g., is maintained at the second level (or high level)), the mode control circuit 150 may control the mode signal MODE to the first level (or low level). In response to the zero current signal ZCS being deactivated (e.g., is maintained at the first level (or low level)), the mode control circuit 150 may control the mode signal MODE to the second level (or high level).

By differently setting a condition (e.g., the detection signal DS) for changing the mode signal MODE from the high level to the low level and a condition (e.g., the zero current signal ZCS) for changing the mode signal MODE from the low level to the high level, the mode control circuit 150 may provide a hysteresis to transition between two modes. Accordingly, the stability of the voltage converter 100 may be improved.

The control logic circuit 160 may receive the zero current signal ZCS from the zero current sensor 130 and may receive the mode signal MODE from the mode control circuit 150. Also, the control logic circuit 160 may receive the input voltage VIN and the output voltage VOUT. The control logic circuit 160 may further receive the comparison signal CPS from the comparison circuit 120. The control logic circuit 160 may control the first control signal CS1 and the second control signal CS2 in response to the comparison signal CPS, the zero current signal ZCS, the mode signal MODE, the input voltage VIN, and the output voltage VOUT.

In some example embodiments, the control logic circuit 160 may control the first control signal CS1 and the second control signal CS2 based on a period. The control logic circuit 160 may switch between a first mode and a second mode based on the mode signal MODE. In the first mode, the control logic circuit 160 may control the first control signal CS1 and the second control signal CS2 based on pulse frequency modulation (PFM) for adjusting a length of the period.

In the second mode, the control logic circuit 160 may complementarily control the first control signal CS1 and the second control signal CS2 within a fixed period. The control logic circuit 160 may control the first control signal CS1 and the second control signal CS2 based on pulse width modulation (PWM) for adjusting a length of a pulse width, in which the first control signal CS1 or the second control signal CS2 has the high level, within a fixed period.

By adaptively selecting one of a PFM mode and a PWM mode depending on the amount of load current ILOAD, the voltage converter 100 may convert the input voltage VIN to the output voltage VOUT with improved power efficiency. In particular, in a system where a change of the amount of load current ILOAD is great, the voltage converter 100 may have more improved power efficiency.

Figure 2:
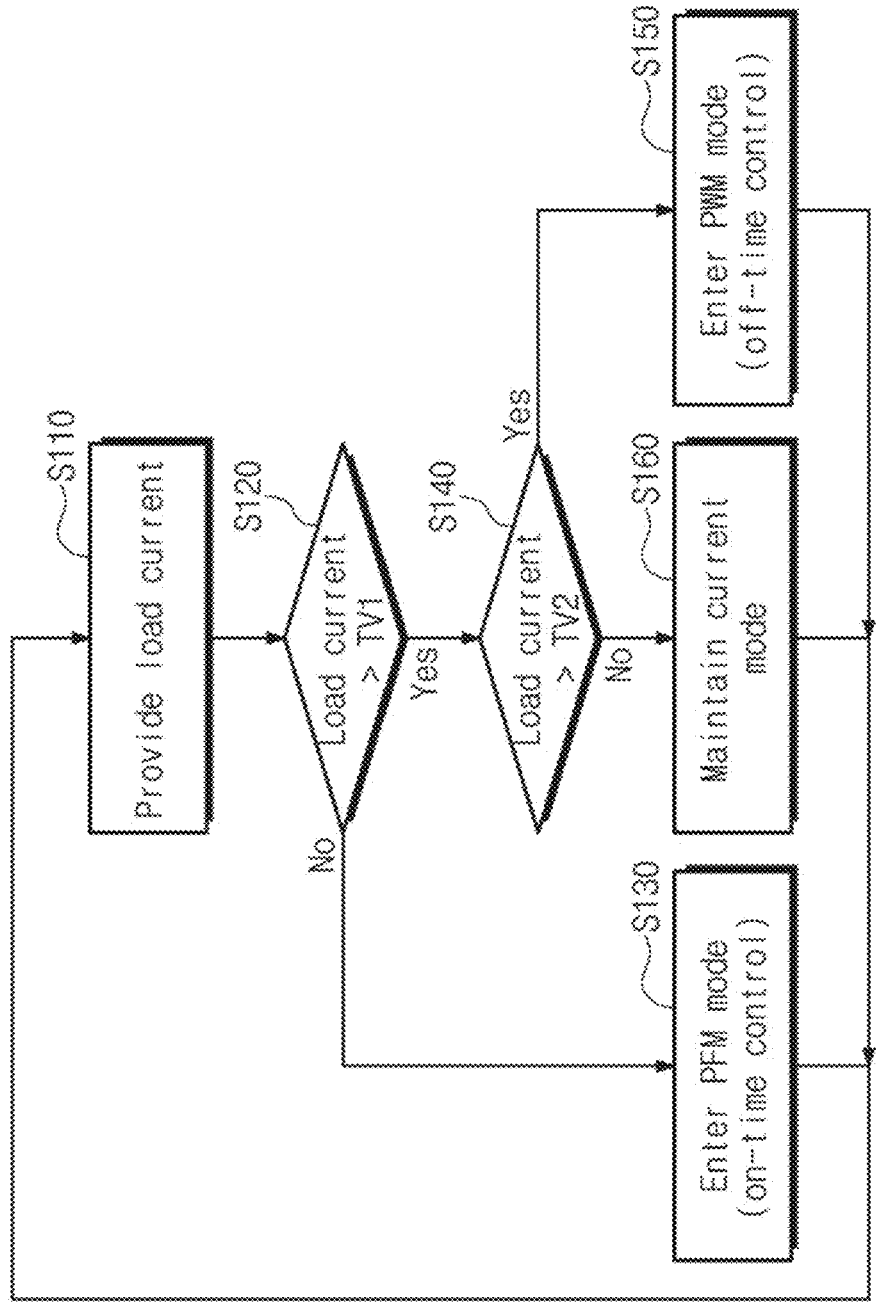
FIG. 2 illustrates an example of an operating method of a voltage converter of FIG. 1.

FIG. 2 illustrates an example of an operating method of the voltage converter 100 of FIG. 1. Referring to FIGS. 1 and 2, in operation S110, the voltage converter 100 may provide the load current ILOAD corresponding to the output voltage VOUT at the output node NO.

The mode control circuit 150 may determine the amount of load current ILOAD. For example, the mode control circuit 150 may determine the amount of load current ILOAD, based on the zero current signal ZCS and the detection signal DS.

In operation S120, the mode control circuit 150 may determine whether the amount of load current ILOAD is greater than a first threshold value TV1. For example, the mode control circuit 150 may determine whether the amount of load current ILOAD is greater than the first threshold value TV1, based on the detection signal DS.

When the amount of load current ILOAD is not greater (e.g., less than or equal to) than the first threshold value TV1, in operation S130, the detection signal DS may be deactivated to the second level (or high level), and the mode control circuit 150 may control the mode signal MODE to the first level (or low level). The control logic circuit 160 may enter the PFM mode and may control the first control signal CS1 and the second control signal CS2 based on the PFM. When the amount of load current ILOAD is greater than the first threshold value TV1, operation S140 is performed.

Also, in operation S140, the mode control circuit 150 may determine whether the amount of load current ILOAD is greater than a second threshold value TV2. For example, the mode control circuit 150 may determine whether the amount of load current ILOAD is greater than the second threshold value TV2, based on the zero current signal ZCS.

When the amount of load current ILOAD is greater than the second threshold value TV2, in operation S150, the zero current signal ZCS may be deactivated to the first level (or low level), and the mode control circuit 150 may control the mode signal MODE to the second level (or high level). The control logic circuit 160 may control the first control signal CS1 and the second control signal CS2 based on the PWM.

When the amount of load current ILOAD is greater than the first threshold value TV1 and when the amount of load current ILOAD is not greater (e.g., less than or equal to) than the second threshold value TV2, in operation S160, the mode control circuit 150 may maintain the mode signal MODE. That is, the control logic circuit 160 may maintain a current mode, for example, the PFM mode or the PWM mode.

In the PFM mode, the control logic circuit 160 may perform on-time control on the first control signal CS1 and the second control signal CS2. In the on-time control, the control logic circuit 160 may control a length of a time, during which the first power transistor 111 is turned on, within a period. In the on-time control, the first power transistor 111 may have a turn-off interval within each period. In the on-time control, the first power transistor 111 may be turned off during each period.

In the PWM mode, the control logic circuit 160 may perform off-time control on the first control signal CS1 and the second control signal CS2. In the off-time control, the control logic circuit 160 may control a length of a time, during which the first power transistor 111 is turned off, within a period. In the off-time control, the first power transistor 111 may have a turn-on interval within each period. In the off-time control, the first power transistor 111 may be turned on during each period.

Figure 3:
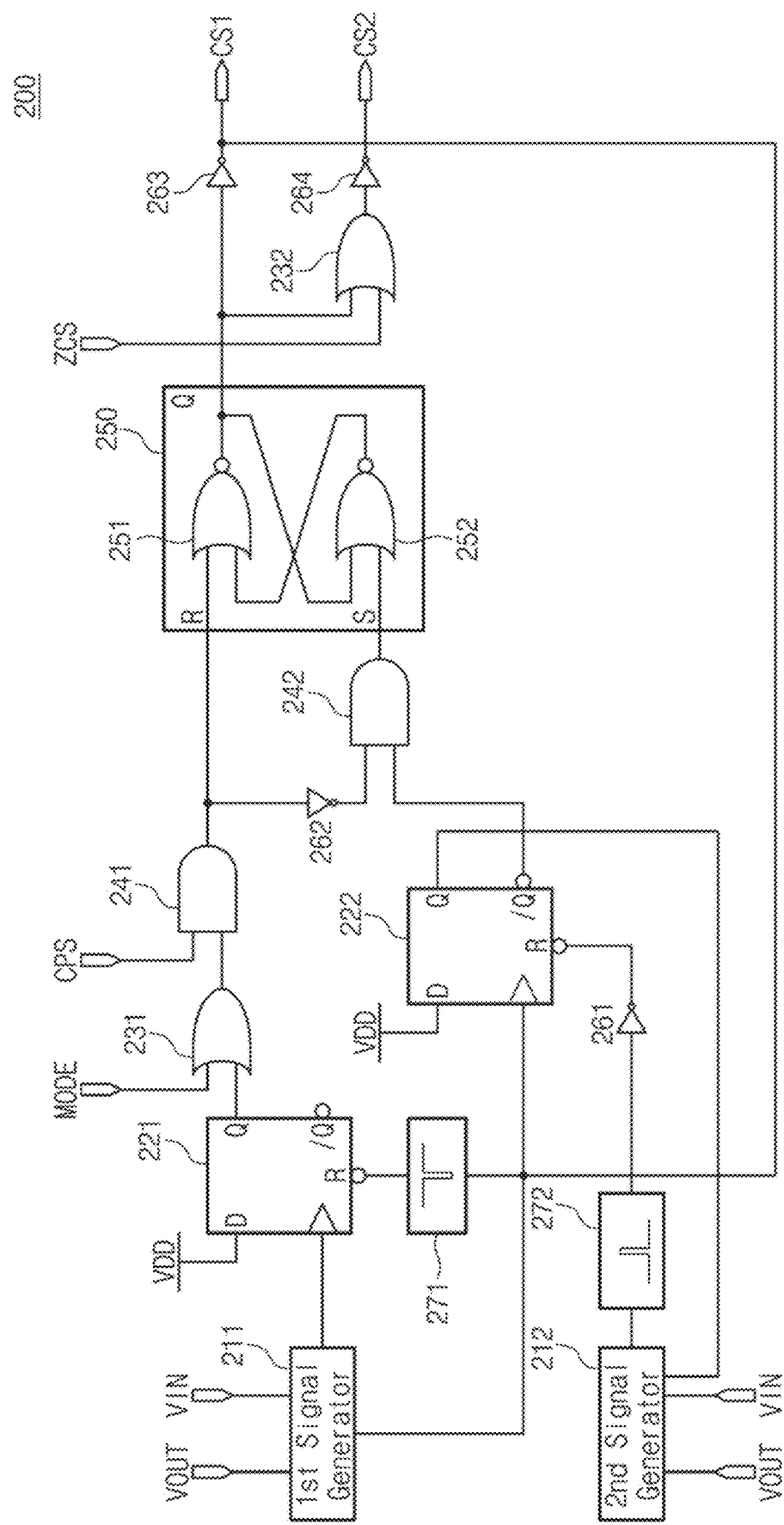
FIG. 3 illustrates a control logic circuit according to some example embodiments of the present disclosure.

FIG. 3 illustrates a control logic circuit 200 according to some example embodiments of the present disclosure. The control logic circuit 200 may correspond to the control logic circuit 160 of FIG. 1. Referring to FIGS. 1 and 3, the control logic circuit 200 may include a first signal generator 211, a second signal generator 212, a first flip-flop 221, a second flip-flop 222, a first OR gate 231, a second OR gate 232, a first AND gate 241, a second AND gate 242, a latch 250, a first inverter 261, a second inverter 262, a third inverter 263, a fourth inverter 264, a first pulse generator 271, and a second pulse generator 272.

The first signal generator 211 may receive the input voltage VIN, the output voltage VOUT, and the first control signal CS1. The first signal generator 211 may output an output signal to a clock input of the first flip-flop 221. The first signal generator 211 may transit the output signal to the high level in synchronization with a falling edge of the first control signal CS1.

After the first control signal CS1 transitions from the high level to the low level and then a specific delay time (e.g., a second delay time TD2) passes, the first signal generator 211 may transit the output signal from the low level to the high level. The second delay time TD2 may be determined by the input voltage VIN and the output voltage VOUT. For example, the second delay time TD2 may be determined by Equation 1 below.

$$\left(\frac{VOUT}{VIN}\right)\bigg/ FS \qquad \text{[Equation 1]}$$

In Equation 1, "FS" may indicate a switching frequency. The switching frequency may correspond to a period that the control logic circuit 200 uses to control the first control signal CS1 and the second control signal CS2 (e.g., may be the reverse of the frequency).

After the first control signal CS1 transitions from the high level to the low level and then a specific delay time (e.g., the second delay time TD2 or a given (e.g., desired) time) passes, when the second control signal CS2 transitions from the low level to the high level, or after the output signal transitions from the low level to the high level and then a given (e.g., desired) time passes, the first signal generator 211 may transit the output signal from the high level to the low level.

The first pulse generator 271 may operate in response to the first control signal CS1. For example, when the first control signal CS1 transitions from the high level to the low level, that is, in synchronization with a falling edge thereof, the first pulse generator 271 may output a pulse that transitions from the high level to the low level and then transitions from the low level to the high level. The pulse generated by the first pulse generator 271 may be transferred to a reset input "R" of the first flip-flop 221.

The first flip-flop 221 may include the clock input to which the output signal of the first signal generator 211 is transferred, the reset input to which the output pulse of the first pulse generator 271 is transferred, a data input "D" to which a power supply voltage VDD is transferred, a non-reverse output "Q" connected with the first OR gate 231, and a reverse output /Q of a floating state.

When the output signal of the first signal generator 211 transferred to the clock input transitions from the low level to the high level (e.g., in synchronization with a rising edge thereof), the non-reverse output "Q" of the first flip-flop 221 may transition from the low level to the high level. When the output signal of the first pulse generator 271 transferred to the reset input "R" transitions from the high level to the low level (e.g., in synchronization with a falling edge thereof), the non-reverse output "Q" of the first flip-flop 221 may transition from the high level to the low level.

The first OR gate 231 may perform an OR operation on the non-reverse output "Q" of the first flip-flop 221 and the mode signal MODE. An output of the first OR gate 231 may be transferred to the first AND gate 241.

The first AND gate 241 may perform an AND operation on the output of the first OR gate 231 and the comparison signal CPS. An output of the first AND gate 241 may be transferred to the second inverter 262 and a reset input "R" of the latch 250.

The second signal generator 212 may receive the input voltage VIN, the output voltage VOUT, and a non-reverse output "Q" of the second flip-flop 222. The second signal generator 212 may output an output signal to the second pulse generator 272. The second signal generator 212 may transit the output signal to the high level in synchronization with a rising edge of the non-reverse output "Q" of the second flip-flop 222.

For example, after the non-reverse output "Q" of the second flip-flop 222 transitions from the low level to the high level and then a delay time (e.g., a sixth delay time TD6) passes, the second signal generator 212 may transit the output signal from the low level to the high level. The sixth delay time TD6 may be determined by the input voltage VIN and the output voltage VOUT. For example, the sixth delay time TD6 may be determined by Equation 2 below.

$$\left(1 - \frac{VOUT}{VIN}\right)\bigg/ FS \qquad \text{[Equation 2]}$$

After the non-reverse output "Q" of the second flip-flop 222 transitions from the low level to the high level and then a specific delay time (e.g., the sixth delay time TD6 or a given (e.g., desired) time) passes, the second signal generator 212 may transit the output signal from the high level to the low level when the non-reverse output "Q" of the second flip-flop 222 transitions from the high level to the low level, or after the output signal transitions from the low level to the high level and then a given (e.g., desired) time passes.

The second pulse generator 272 may operate in response to the output signal of the second signal generator 212. For example, when the output signal of the second signal generator 212 transitions from the low level to the high level, that is, in synchronization with a rising edge thereof, the second pulse generator 272 may output a pulse that transitions from the low level to the high level and then transitions from the high level to the low level. The pulse generated by the second pulse generator 272 may be transferred to the first inverter 261.

The first inverter 261 may invert the pulse output from the second pulse generator 272 so as to be transferred to a reset input "R" of the second flip-flop 222.

The second flip-flop 222 may include a clock input to which the first control signal CS1 is transferred, a data input "D" to which the power supply voltage VDD is transferred, the non-reverse output "Q" connected with the second signal generator 212, and a reverse output /Q transferred to the second AND gate 242.

When the first control signal CS1 transitions from the low level to the high level (e.g., in synchronization with a rising edge thereof), the non-reverse output "Q" of the second flip-flop 222 may transition from the low level to the high level, and the reverse output /Q of the second flip-flop 222 may transition from the high level to the low level. When the output signal of the inverter 261 transitions from the high level to the low level (e.g., in synchronization with a falling edge thereof), the non-reverse output "Q" of the second flip-flop 222 may transition from the high level to the low level, and the reverse output /Q of the second flip-flop 222 may transition from the low level to the high level.

The second inverter 262 may invert an output of the first AND gate 241 so as to be output to the second AND gate 242. The second AND gate 242 may perform an AND operation on the output of the second inverter 262 and the reverse output /Q of the second flip-flop 222. An output of the second AND gate 242 may be transferred to a set input "S" of the latch 250.

The latch 250 may include a first NOR gate 251 and a second NOR gate 252. The first NOR gate 251 may perform a NOR operation on the reset input "R" and an output of the second NOR gate 252. An output of the first NOR gate 251 may be a non-reverse output "Q" of the latch 250.

The second NOR gate 252 may perform a NOR operation on the set input "S" and the output of the first NOR gate 251. An output of the second NOR gate 252 may be transferred to the first NOR gate 251. The non-reverse output "Q" of the latch 250 may be transferred to the third inverter 263 and the second OR gate 232.

The third inverter 263 may invert the non-reverse output "Q" and may output the inverted output as the first control signal CS1. The second OR gate 232 may perform an OR operation on the non-reverse output "Q" of the latch 250 and the zero current signal ZCS. An output of the second OR gate 232 may be transferred to the fourth inverter 264. The fourth inverter 264 may invert an output of the second OR gate 232 and may output the inverted output as the second control signal CS2.

Figure 4:
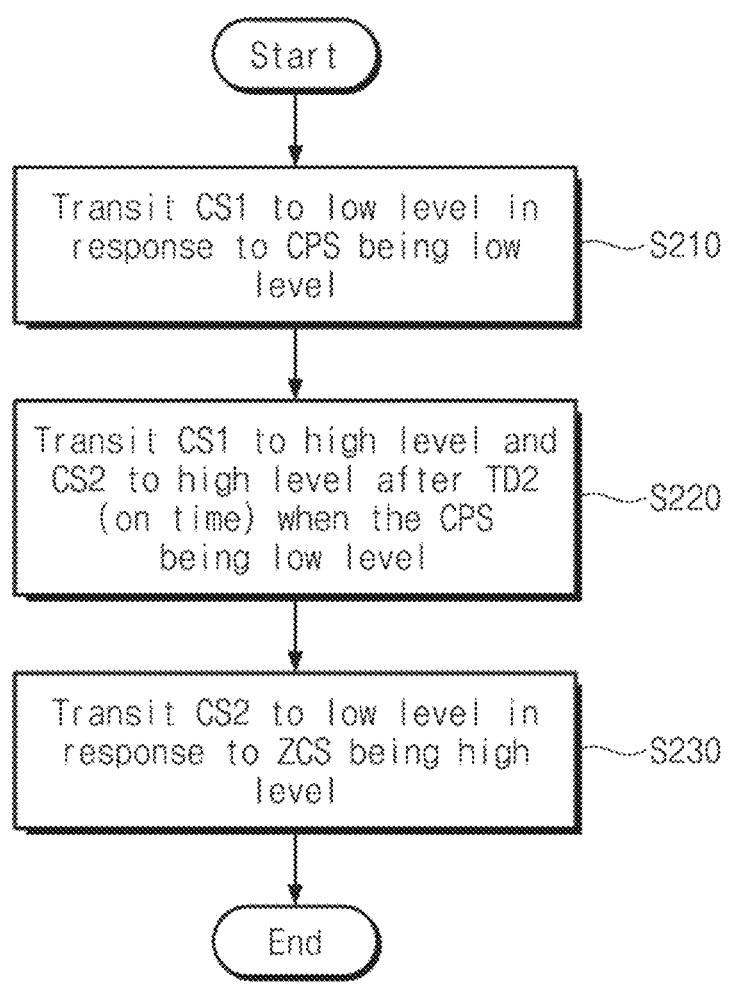
FIG. 4 illustrates an example of a procedure in which a control logic circuit operates in a PFM mode.

FIG. 4 illustrates an example of a procedure in which the control logic circuit 200 operates in the PFM mode. Referring to FIGS. 1, 3, and 4, in operation S210, the control logic circuit 200 may transit the first control signal CS1 from the high level to the low level in response to the comparison signal CPS being set to the low level.

After the second delay time TD2, for example, an on-time passes from when the comparison signal CPS is set to the low level, in operation S220, the control logic circuit 200 may transit the first control signal CS1 from the low level to the high level and may transit the second control signal CS2 from the low level to the high level.

In operation S230, in response to the zero current signal ZCS being set to the high level, the control logic circuit 200 may transit the second control signal CS2 from the high level to the low level.

Figure 5:
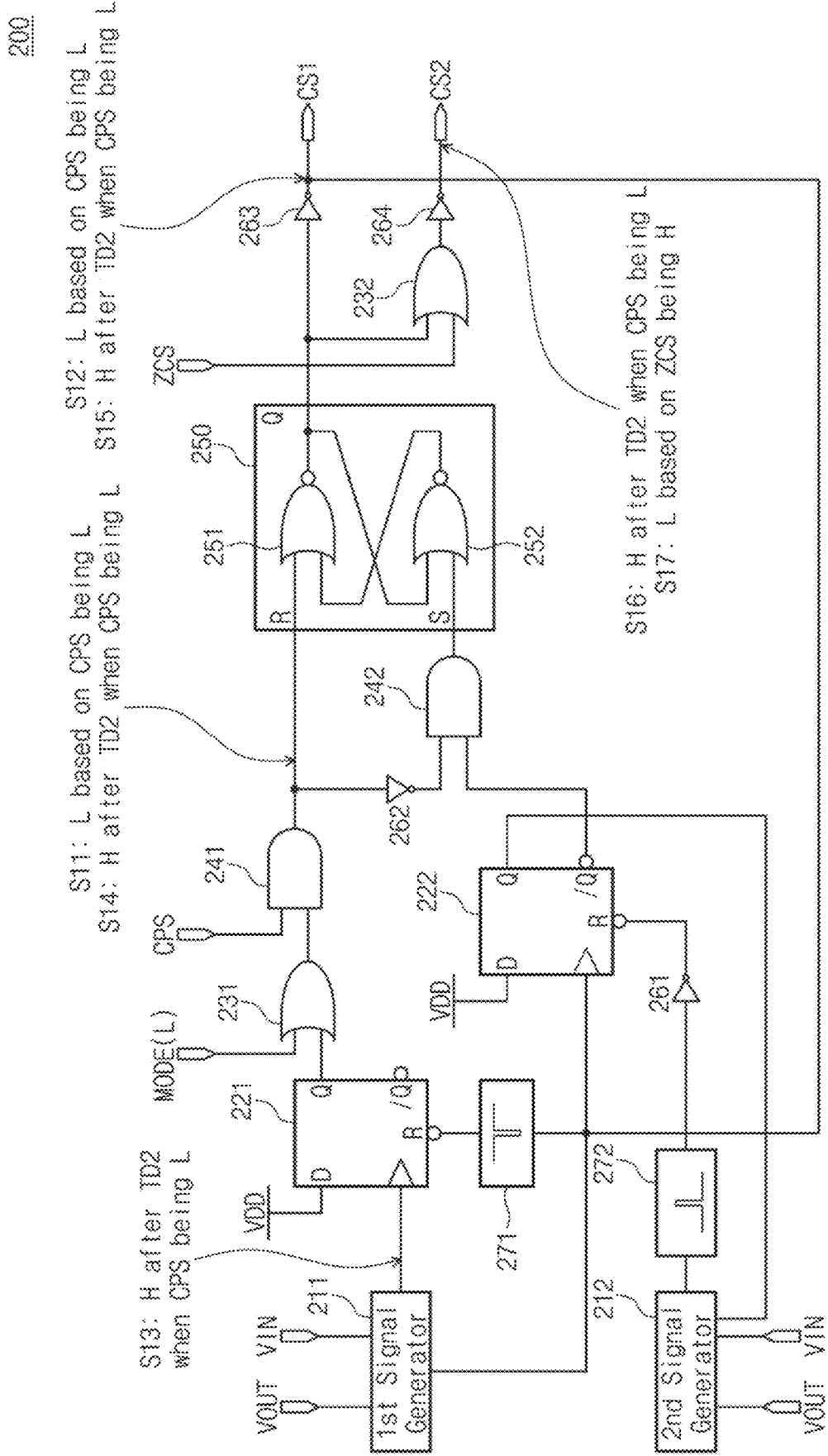
FIG. 5 illustrates a method in which signals of a control logic circuit are controlled in a PFM mode.
Figure 6:
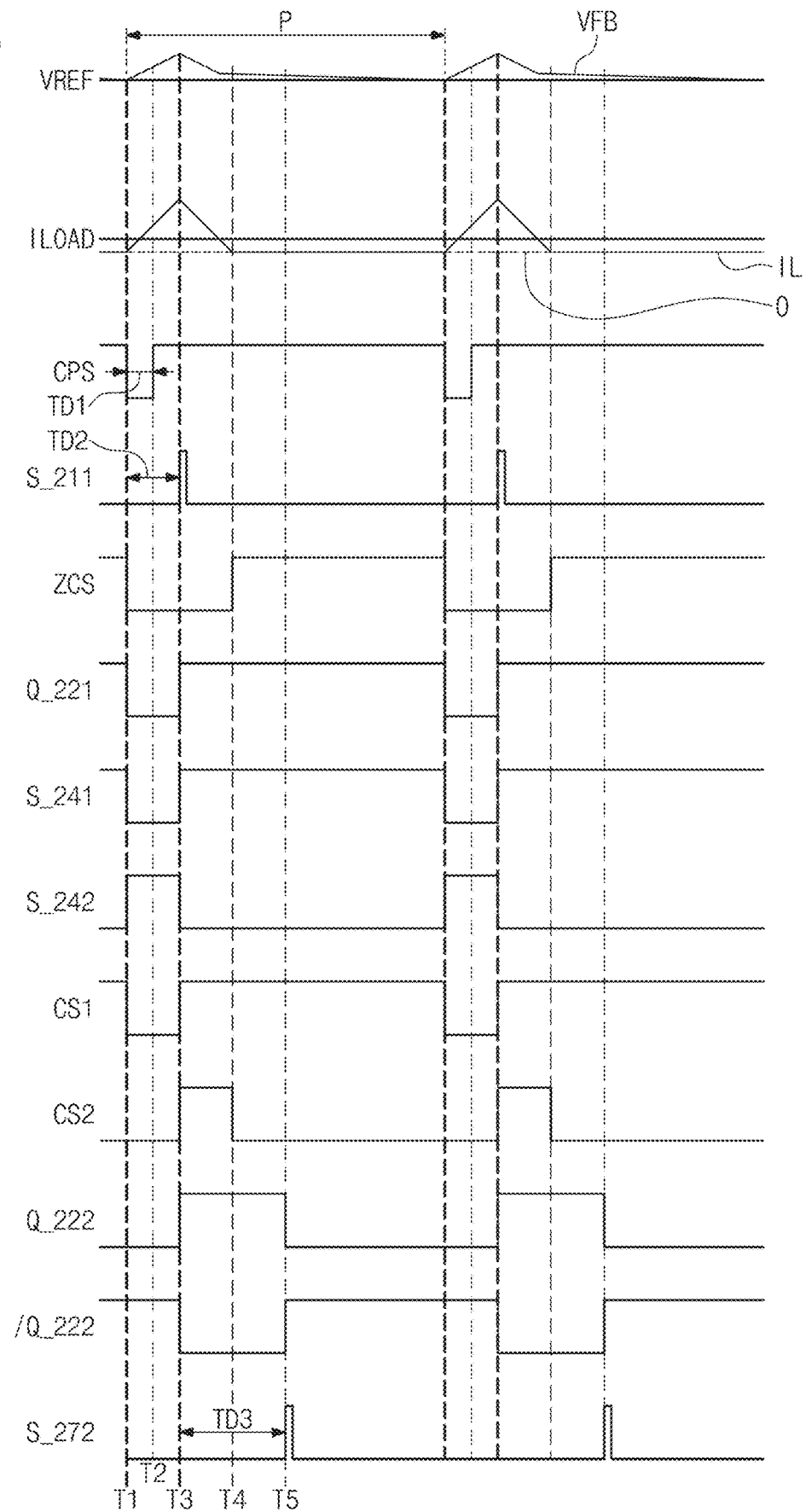
FIG. 6 illustrates an example in which signals of a voltage converter are controlled by a control logic circuit in a PFM mode.

FIG. 5 illustrates a method in which signals of the control logic circuit 200 are controlled in the PFM mode. FIG. 6 illustrates an example in which signals of the voltage converter 100 are controlled by the control logic circuit 200 in the PFM mode.

Referring to FIGS. 1, 5, and 6, a comparison of the feedback voltage VFB and the reference voltage VREF is shown. A comparison of the load current ILOAD and the inductor current IL is shown. A signal S_211 may be an output of the first signal generator 211. A signal Q_221 may be the non-reverse output "Q" of the first flip-flop 221. A signal S_241 may be an output of the first AND gate 241. A signal S_242 may be an output of the second AND gate 242. A signal Q_222 may be the non-reverse output "Q" of the second flip-flop 222. A signal /Q_222 may be the reverse output /Q of the second flip-flop 222. A signal S_272 may be an output of the second pulse generator 272.

In the PFM mode, the mode signal MODE may have the low level "L". At a first time T1, in synchronization with a falling edge of the first control signal CS1, the first pulse generator 271 may output a pulse that transitions from the high level to the low level and then transitions from the low level to the high level. In response to a falling edge of the output pulse of the first pulse generator 271, the non-reverse output Q_221 of the first flip-flop 221 may transition from the high level to the low level.

As the feedback voltage VFB is not greater (e.g., less than or equal to) than the reference voltage VREF (or approaches to the reference voltage VREF within a preset (e.g., desired) voltage), the comparison signal CPS may transition from the high level to the low level. As marked by operation S11, in response to the comparison signal CPS being set to the low level "L" (or in response to the non-reverse output Q_221 of the first flip-flop 221 transitioning from the high level to the low level), an output signal S_241 of the first AND gate 241 may transition from the high level to the low level.

In response to the output signal S_241 of the first AND gate 241 being set to the low level, an output of the inverter 262 may transition from the low level to the high level. In an initial state, the reverse output /Q_222 of the second flip-flop 222 may be at the high level. Accordingly, the output signal S_242 of the second AND gate 242 may transition from the low level to the high level. That is, the latch 250 may be set, and an output of the latch 250 may transition from the low level to the high level.

The output of the latch 250 may be output as the first control signal CS1 through the third inverter 263. Accordingly, as marked by operation S12, the first control signal CS1 may transition from the high level to the low level in response to the comparison signal CPS being set to the low level. As the first control signal CS1 transitions from the high level to the low level, the gate driver 113 may transit the first drive signal DRV1 from the high level to the low level. Accordingly, the first power transistor 111 may be turned on.

As the first power transistor 111 is turned on, the inductor LN and the capacitor "C" may be connected with the input node NI through the first power transistor 111 and may be charged by the input voltage VIN. Because a current flows through the switch node NSW, the zero current signal ZCS may transition from the high level to the low level.

Because the zero current signal ZCS transitions from the high level to the low level and the output of the latch 250 transitions from the low level to the high level, an output of the second OR gate 232 may maintain the high level. The fourth inverter 264 may invert the output of the second OR gate 232 to output the second control signal CS2. Accordingly, the second control signal CS2 may maintain the low level.

As the second control signal CS2 maintains the low level, the gate driver 113 may maintain the second drive signal DRV2 at the low level. Accordingly, the second power transistor 112 may be turned off.

As the first power transistor 111 is turned on and the second power transistor 112 is turned off, the inductor current IL may increase, and the output voltage VOUT may increase. As the output voltage VOUT increases, the feedback voltage VFB may also increase. As the feedback voltage VFB is greater than the reference voltage VREF, after a first delay time TD1, that is, at a second time T2, the comparison signal CPS may transition from the low level to the high level.

In some example embodiments, an absolute value of a slope at which the feedback voltage VFB decreases when the feedback voltage VFB is not greater (e.g., less than or equal to) than the reference voltage VREF (or approaches to the reference voltage VREF within a preset (e.g., desired) voltage) may be smaller than an absolute value of a slope at which the feedback voltage VFB increases as the first power transistor 111 is turned on. That is, when the feedback voltage VFB is not greater (e.g., less than or equal to) than the reference voltage VREF (or approaches to the reference voltage VREF within a preset (e.g., desired) voltage), the feedback voltage VFB may decrease relatively slowly. The comparator 122 may transit the comparison signal CPS from the high level to the low level without a delay.

After the second delay time TD2 (e.g., an on-time) passes from when the comparison signal CPS transitions from the high level to the low level (e.g., from the first time T1), at a third time T3 (as marked by operation S13), the first signal generator 211 may transit the output signal S_211 from the low level to the high level.

In response to the output signal S_211 of the first signal generator 211 transitioning from the low level to the high level (e.g., in synchronization with a rising edge thereof), the non-reverse output Q_221 of the first flip-flop 221 may transition from the low level to the high level. Accordingly, the output signal of the first OR gate 231 may also transition from the low level to the high level.

Because the comparison signal CPS is at the high level and the non-reverse output Q_221 of the first flip-flop 221 transitions from the low level to the high level, as marked by operation S14, the output signal S_241 of the first AND gate 241 may transition from the low level to the high level after the second delay time TD2 (e.g., an on-time) passes from when the comparison signal CPS is set to the low level "L". As the output signal S_241 of the first AND gate 241 is set to the high level, an output signal of the second inverter 262 may transition from the high level to the low level.

As the output signal S_241 of the first AND gate 241 is set to the high level, the latch 250 may be reset. The non-reverse output "Q" of the latch 250 may transition from the high level to the low level. That is, as marked by operation S15, after the second delay time TD2 (e.g., an on-time) passes from when the comparison signal CPS is set to the low level, the first control signal CS1 may transition to the high level "H".

In response to the first control signal CS1 transitioning from the low level to the high level, the gate driver 113 may transit the first drive signal DRV1 from the low level to the high level. Accordingly, the first power transistor 111 may be turned off.

Because the zero current signal ZCS is at the low level and the non-reverse output "Q" of the latch 250 is at the low level, the output of the second OR gate 232 is set to the low level. That is, as marked by operation S16, after the second delay time TD2 (e.g., an on-time) passes from when the comparison signal CPS is set to the low level "L", the second control signal CS2 may transition to the high level "H".

In response to the second control signal CS2 transitioning from the low level to the high level, the gate driver 113 may transit the second drive signal DRV2 from the low level to the high level. Accordingly, the second power transistor 112 may be turned on.

As the first power transistor 111 is turned off and the second power transistor 112 is turned on, the inductor current IL may decrease, and the feedback voltage VFB may decrease.

A slope at which the feedback voltage VFB decreases may be variable in a first phase and a second phase. For example, a decreasing slope of the first phase may be greater than a decreasing slope of the second phase. In the first phase, a decrease of the feedback voltage VFB may be caused by a decrease of the amount of inductor current IL. The second phase may start at a time when the amount of inductor current IL is smaller than the load current ILOAD.

In the second phase, a decrease of the feedback voltage VFB may be caused by the load current ILOAD. Because the PFM mode is selected when the amount of load current ILOAD is small, the decrease of the feedback voltage VFB due to the load current ILOAD may be smaller than the decrease of the feedback voltage VFB due to the decrease of the inductor current IL.

At a fourth time T4 when the inductor current IL is "0", the zero current sensor 130 may transit the zero current signal ZCS from the low level to the high level. In response to the zero current signal ZCS transitioning to the high level, the output of the second OR gate 232 may transition from the low level to the high level. That is, as marked by operation S17, the second control signal CS2 may be set to the low level "L" in response to the zero current signal ZCS being set to the high level "H".

In response to the second control signal CS2 transitioning from the high level to the low level, the gate driver 113 may transit the second drive signal DRV2 from the high level to the low level. Accordingly, the second power transistor 112 may be turned off.

After a third delay time TD3 passes from when the first control signal CS1 transitions from the low level to the high level, that is, at a fifth time T5, the second signal generator 212 may transit the output signal from the low level to the high level. In response to the output signal of the second signal generator 212 transitioning from the low level to the high level, the second pulse generator 272 may output a pulse.

The first inverter 261 may invert the output pulse of the second pulse generator 272 and may transfer the inverted pulse to the reset input "R" of the second flip-flop 222. In response to the output signal of the inverter 261 transitioning from the high level to the low level, the non-reverse output "Q" of the second flip-flop 222 may transition from the high level to the low level, and the reverse output /Q of the second flip-flop 222 may transition from the low level to the high level.

The second signal generator 212 may not adjust the output signal when the non-reverse output "Q" of the second flip-flop 222 transitions to the low level. Also, because the output signal S_241 of the first AND gate 241 is set to the high level already at the third time T3, a low-to-high transition of the reverse output /Q_222 of the second flip-flop 222 may not affect the output signal S_242 of the second AND gate 242.

To sum up, in the PFM mode, the voltage converter 100 may differently control the first power transistor 111 and the second power transistor 112 in a first time interval, a second time interval, and a third time interval of each period "P".

The first time interval may include a time interval from the first time T1 to the third time T3. In the first time interval, the voltage converter 100 may turn on the first power transistor 111 and may turn off the second power transistor 112. During the first time interval, the voltage converter 100 may increase the output voltage VOUT.

The second time interval may include a time interval from the third time T3 to the fourth time T4. In the second time interval, the voltage converter 100 may turn off the first power transistor 111 and may turn on the second power transistor 112. During the second time interval, the voltage converter 100 may decrease the output voltage VOUT.

The third time interval may include the remaining time interval of each period "P" other than the first time interval and the second time interval. In the third time interval, the voltage converter 100 may turn off the first power transistor 111 and may turn off the second power transistor 112. During the third time interval, the voltage converter 100 may provide charges charged in the inductor LN or the capacitor "C" to the load current ILOAD.

The voltage converter 100 may perform the PFM operation of adjusting a length of the period "P" by adjusting a length of the third time length. For example, as the load current ILOAD increases, the voltage converter 100 may decrease a length of the third time length, and thus, a length of the period "P" may decrease. In some example embodiments, where the length of the third time interval decreases, a time taken to provide charges charged during the same time to the load current ILOAD may decrease. That is, a charging interval may decrease.

As the load current ILOAD decreases, the voltage converter 100 may increase a length of the third time length, and thus, a length of the period "P" may increase. In some example embodiments, where the length of the third time interval increases, a time taken to provide charges charged during the same time to the load current ILOAD may increase. That is, a charging interval may increase.

Figure 7:
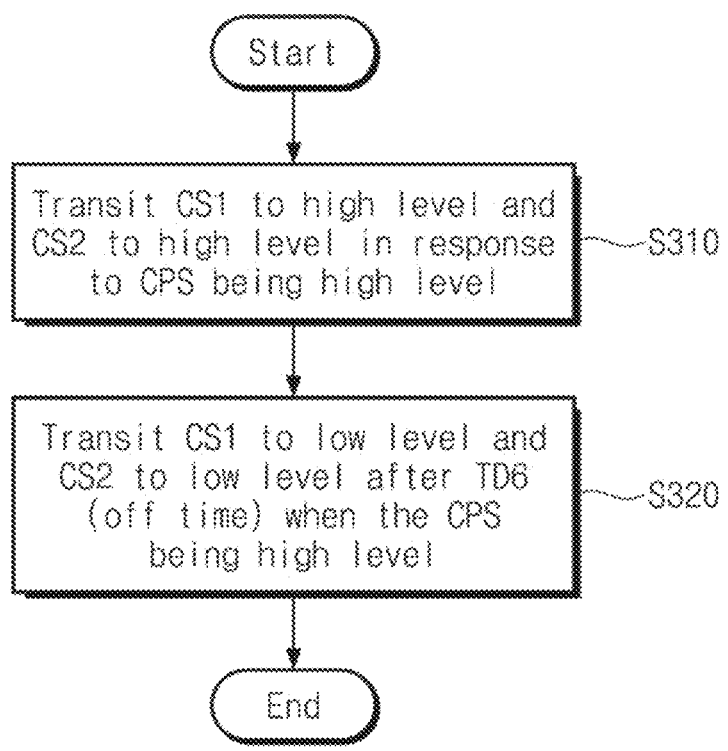
FIG. 7 illustrates an example of a procedure in which a control logic circuit operates in a PWM mode.

FIG. 7 illustrates an example of a procedure in which the control logic circuit 200 operates in the PWM mode. Referring to FIGS. 1, 3, and 7, in operation S310, in response to the comparison signal CPS being set to the high level, the control logic circuit 200 may transit the first control signal CS1 from the low level to the high level and may transit the second control signal CS2 from the low level to the high level.

After the sixth delay time TD6, for example, an off-time passes from when the comparison signal CPS is set to the high level, in operation S320, the control logic circuit 200 may transit the first control signal CS1 from the high level to the low level and may transit the second control signal CS2 from the high level to the low level.

Figure 8:
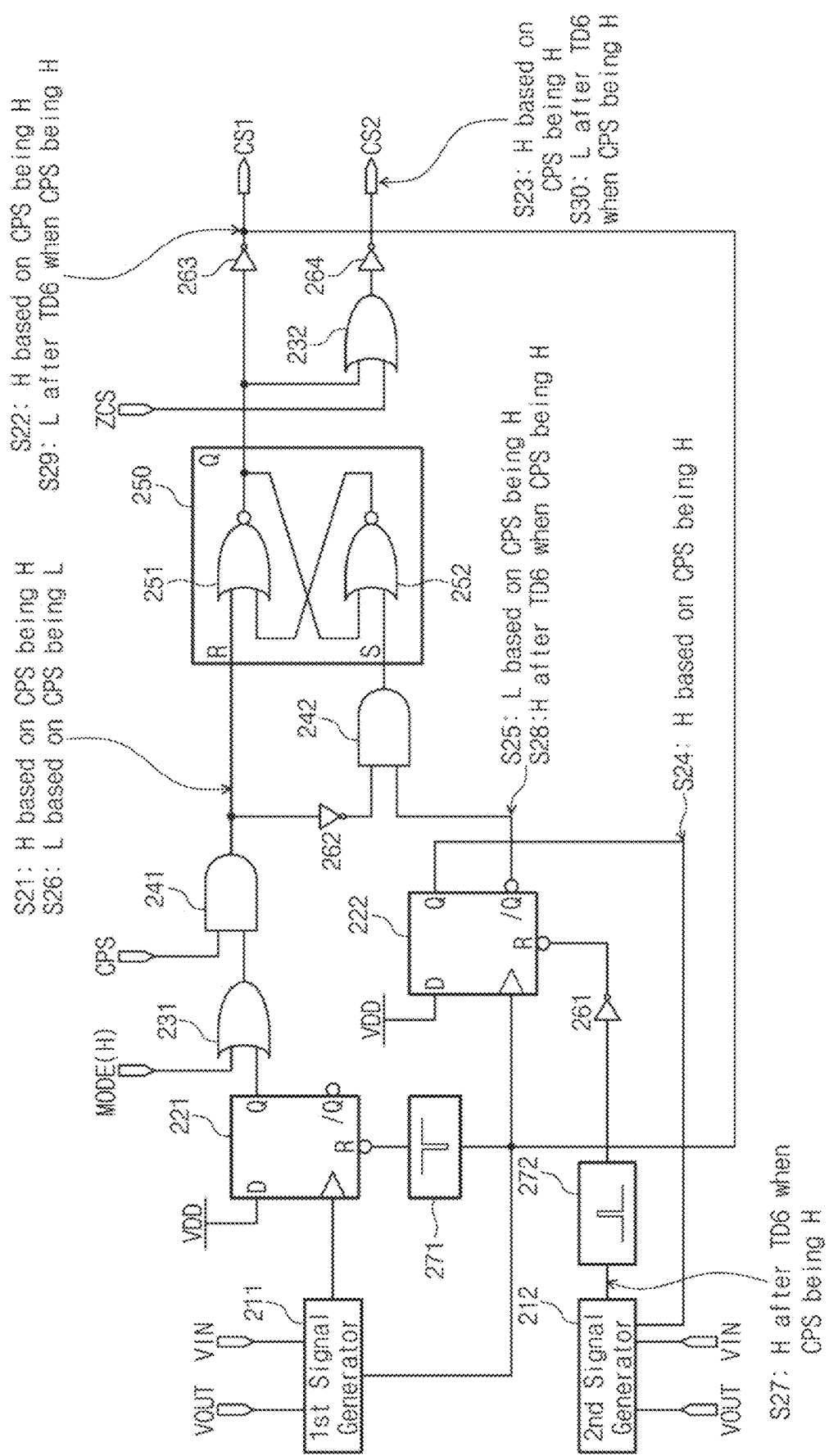
FIG. 8 illustrates a method in which signals of a control logic circuit are controlled in a PWM mode.
Figure 9:
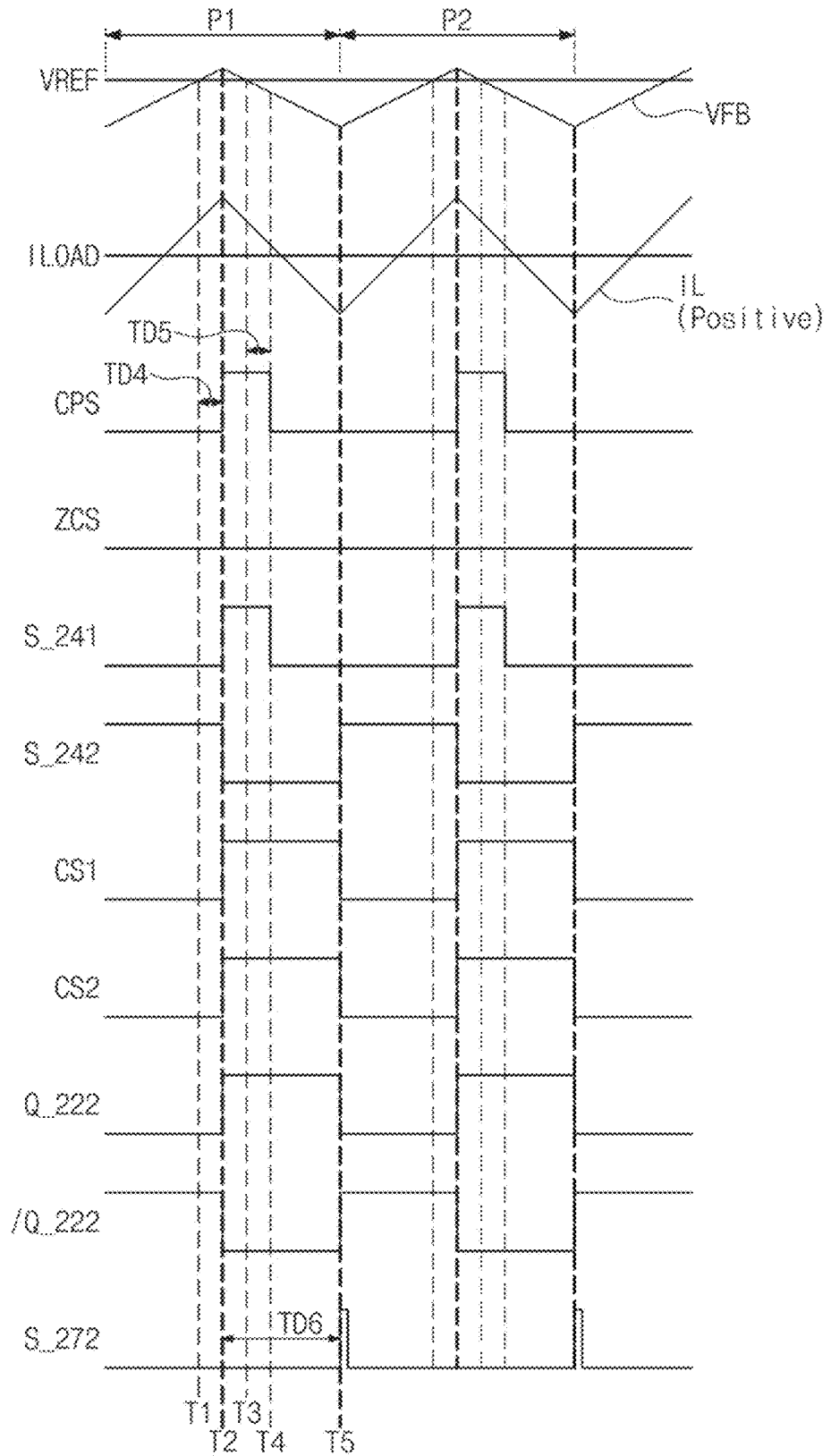
FIG. 9 illustrates an example in which signals of a voltage converter are controlled by a control logic circuit in a PWM mode.

FIG. 8 illustrates a method in which signals of the control logic circuit 200 are controlled in the PWM mode. FIG. 9 illustrates an example in which signals of the voltage converter 100 are controlled by the control logic circuit 200 in the PWM mode.

Referring to FIGS. 1, 8, and 9, a comparison of the feedback voltage VFB and the reference voltage VREF is shown. A comparison of the load current ILOAD and the inductor current IL is shown. A signal S_211 may be an output of the first signal generator 211. A signal S_241 may be an output of the first AND gate 241. A signal S_242 may be an output of the second AND gate 242. A signal Q_222 may be the non-reverse output "Q" of the second flip-flop 222. A signal /Q_222 may be the reverse output /Q of the second flip-flop 222. A signal S_272 may be an output of the second pulse generator 272.

Compared to FIG. 6, the output signal S_211 of the first signal generator 211 and the non-reverse output Q_221 of the first flip-flop 221 are omitted. In the PWM mode, the mode signal MODE may have the high level "H". Accordingly, the output signal of the first OR gate 231 may be at the high level "H". Because the output signal S_211 of the first signal generator 211 and the non-reverse output Q_221 of the first flip-flop 221 do not affect the output signal of the first OR gate 231, the output signal S_211 and the non-reverse output Q_221 are omitted in FIG. 9.

In the PWM mode, the mode signal MODE may have the high level "H". Accordingly, the output signal S_241 of the first AND gate 241 may follow the comparison signal CPS. For example, the output signal S_241 of the first AND gate 241 may be the same (or, similar, for example, within ±10%) as the comparison signal CPS.

Each period may include a first time interval and a second time interval. During the first time interval, the feedback voltage VFB and the inductor current IL may increase; during the second time interval, the feedback voltage VFB and the inductor current IL may decrease. To convey some of the technical features of the present disclosure easily, the second time interval following the first time interval is described in the first period P1, and the first time interval preceding the second time interval is described in the second period P2.

At a first time T1, the feedback voltage VFB may be greater than the reference voltage VREF. After a fourth delay time TD4 passes from the first time T1, that is, at a second time T2, the comparator 122 may transit the comparison signal CPS from the low level to the high level. For example, the fourth delay time TD4 may be an operation delay of the comparator 122. The fourth delay time TD4 may be the same as or similar (e.g., within ±10%) to the first delay time TD1 of FIG. 6.

As marked by operation S21, the output signal S_241 of the first AND gate 241 may transition to the high level "H" in response to the comparison signal CPS being set to the high level "H". The latch 250 may be reset in response to the output signal S_241 of the first AND gate 241 transitioning from the low level to the high level.

As the latch 250 is reset, the non-reverse output "Q" of the latch 250 may be set to the low level, and the first control signal CS1 may transition from the low level to the high level. That is, as marked by operation S22, the first control signal CS1 may be set to the high level in response to the comparison signal CPS being set to the high level "H".

In some example embodiments, in the PWM mode, the inductor current IL may have a positive value, and the zero current signal ZCS may maintain the low level. Accordingly, the output signal of the second OR gate 232 may follow the output signal of the latch 250. For example, the output signal of the second OR gate 232 may be the same (or, similar, for example, within ±10%) as the output signal of the latch 250. Accordingly, as marked by operation S23, the second control signal CS2 may be set to the high level "H" in response to the comparison signal CPS being set to the high level "H".

In response to the first control signal CS1 transitioning from the low level to the high level, as marked by operation S24, the non-reverse output Q_222 of the second flip-flop 222 may transition from the low level to the high level. Also, as marked by operation S25, the reverse output /Q_222 of the second flip-flop 222 may transition from the high level to the low level.

At a third time T3, the feedback voltage VFB may be smaller than the reference voltage VREF. After a fifth delay time TD5 passes from the third time T3, that is, at a fourth time T4, the comparator 122 may transit the comparison signal CPS from the high level to the low level. For example, the fifth delay time TD5 may be an operation delay of the comparator 122. The fifth delay time TD5 may be the same as or similar (for example, within ±10%) to the first delay time TD1 of FIG. 6 or the fourth delay time TD4 of FIG. 9.

In response to the comparison signal CPS transitioning to the low level "L", as marked by operation S26, the output signal S_241 of the first AND gate 241 may transition to the low level "L". As the output signal S_241 of the first AND gate 241 transitions from the high level to the low level, the output signal of the second inverter 262 may transition from the low level to the high level.

After a sixth delay time TD6 (e.g., an off-time) passes from when the comparison signal CPS is set to the high level, at a fifth time T5 (as marked by operation S27), the second signal generator 212 may transit the output signal from the low level to the high level.

In response to the output signal of the second signal generator 212 transitioning from the low level to the high level (e.g., in synchronization with a rising edge thereof), the second pulse generator 272 may output a pulse that transitions from the low level to the high level and then transitions from the high level to the low level. The first inverter 261 may invert the output pulse of the second pulse generator 272 and may transfer the inverted pulse to the reset input "R" of the second flip-flop 222.

In response to the output signal of the inverter 261 transitioning from the high level to the low level, the non-reverse output Q_222 of the second flip-flop 222 may transition from the high level to the low level. As marked by operation S28, in response to the output signal of the inverter 261 transitioning from the high level to the low level, the reverse output /Q_222 of the second flip-flop 222 may transition from the low level to the high level.

The second signal generator 212 may not adjust the output signal when the non-reverse output Q_222 of the second flip-flop 222 transitions to the low level. Also, because the output signal S_241 of the first AND gate 241 is set to the low level already at the fourth time T4, the output signal S_242 of the second AND gate 242 may transition from the low level to the high level in response to a low-to-high transition of the reverse output /Q_222 of the second flip-flop 222. That is, the latch 250 may be set.

As the latch 250 is set, the non-reverse output "Q" of the latch 250 may transition from the low level to the high level. That is, as marked by operation S29, after the sixth delay time TD6 (e.g., an off-time) passes from when the comparison signal CPS is set to the high level "H", the first control signal CS1 may transition to the low level "L". Also, as marked by operation S30, after the sixth delay time TD6 (e.g., an off-time) passes from when the comparison signal CPS is set to the high level "H", the second control signal CS2 may transition to the low level "L".

To sum up, in the PWM mode, a length (or a frequency) of the period "P" may be fixed. The voltage converter 100 may differently control the first power transistor 111 and the second power transistor 112 in a first time interval and a second time interval of each period "P".

In each period "P", the first time interval may precede the second time interval. In the first time interval, the voltage converter 100 may turn on the first power transistor 111 and may turn off the second power transistor 112. During the first time interval, the voltage converter 100 may increase the output voltage VOUT.

The second time interval may follow the first time interval. In the second time interval, the voltage converter 100 may turn off the first power transistor 111 and may turn on the second power transistor 112. During the second time interval, the voltage converter 100 may decrease the output voltage VOUT.

The voltage converter 100 may perform the PWM operation of adjusting a duty (or a duty ratio) in the period "P" by adjusting a length of the first time interval and a length of the second time interval. For example, as the load current ILOAD increases, the voltage converter 100 may increase a length of the first time interval and may decrease a length of the second time interval. In some example embodiments, where the length of the first time interval increases, a time allocated to charge the inductor LN and the capacitor "C" may increase.

As the load current ILOAD decreases, the voltage converter 100 may decrease a length of the first time interval and may increase a length of the second time interval. In some example embodiments, where the length of the first time interval decreases, a time allocated to charge the inductor LN and the capacitor "C" may decrease.

Figure 10:
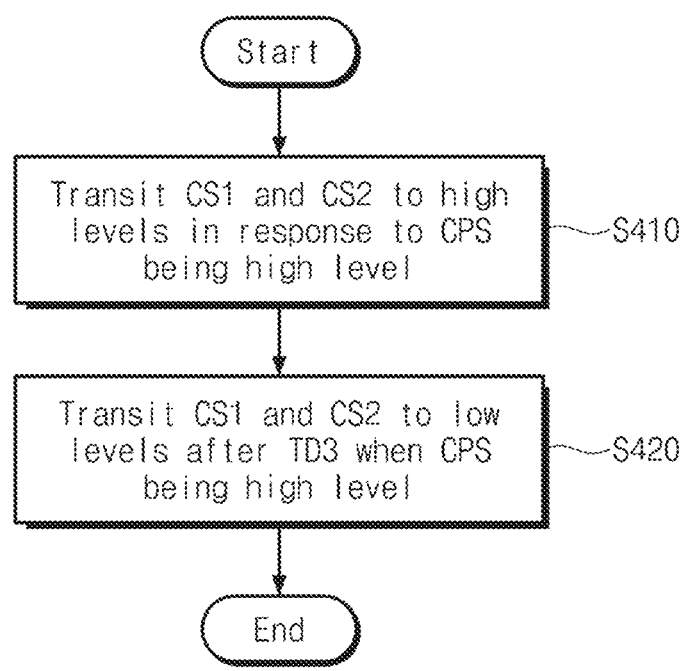
FIG. 10 illustrates an example of a procedure in which a control logic circuit enters a PWM mode from a PFM mode.

FIG. 10 illustrates an example of a procedure in which the control logic circuit 200 enters the PWM mode from the PFM mode. Referring to FIGS. 1, 3, and 10, in operation S410, in response to the comparison signal CPS being set to the high level, the control logic circuit 200 may transit the first control signal CS1 to the high level and may transit the second control signal CS2 from the high level.

After the three delay time TD3, for example, an off-time passes from when the comparison signal CPS is set to the high level, in operation S420, the control logic circuit 200 may transit the first control signal CS1 to the low level and may transit the second control signal CS2 to the low level.

Figure 11:
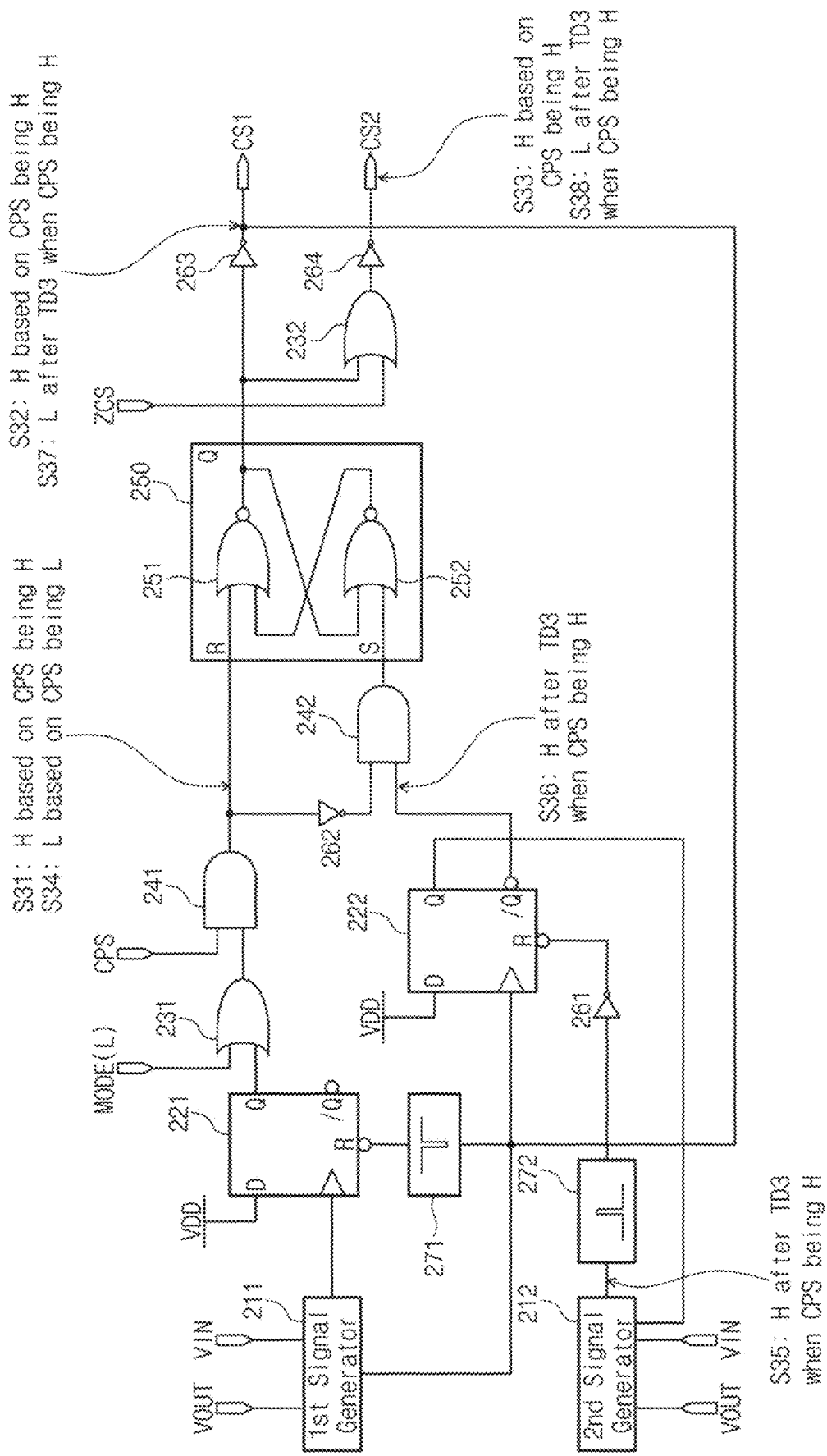
FIG. 11 illustrates a method in which signals of a control logic circuit are controlled in the process where a control logic circuit enters a PWM mode from a PFM mode.
Figure 12:
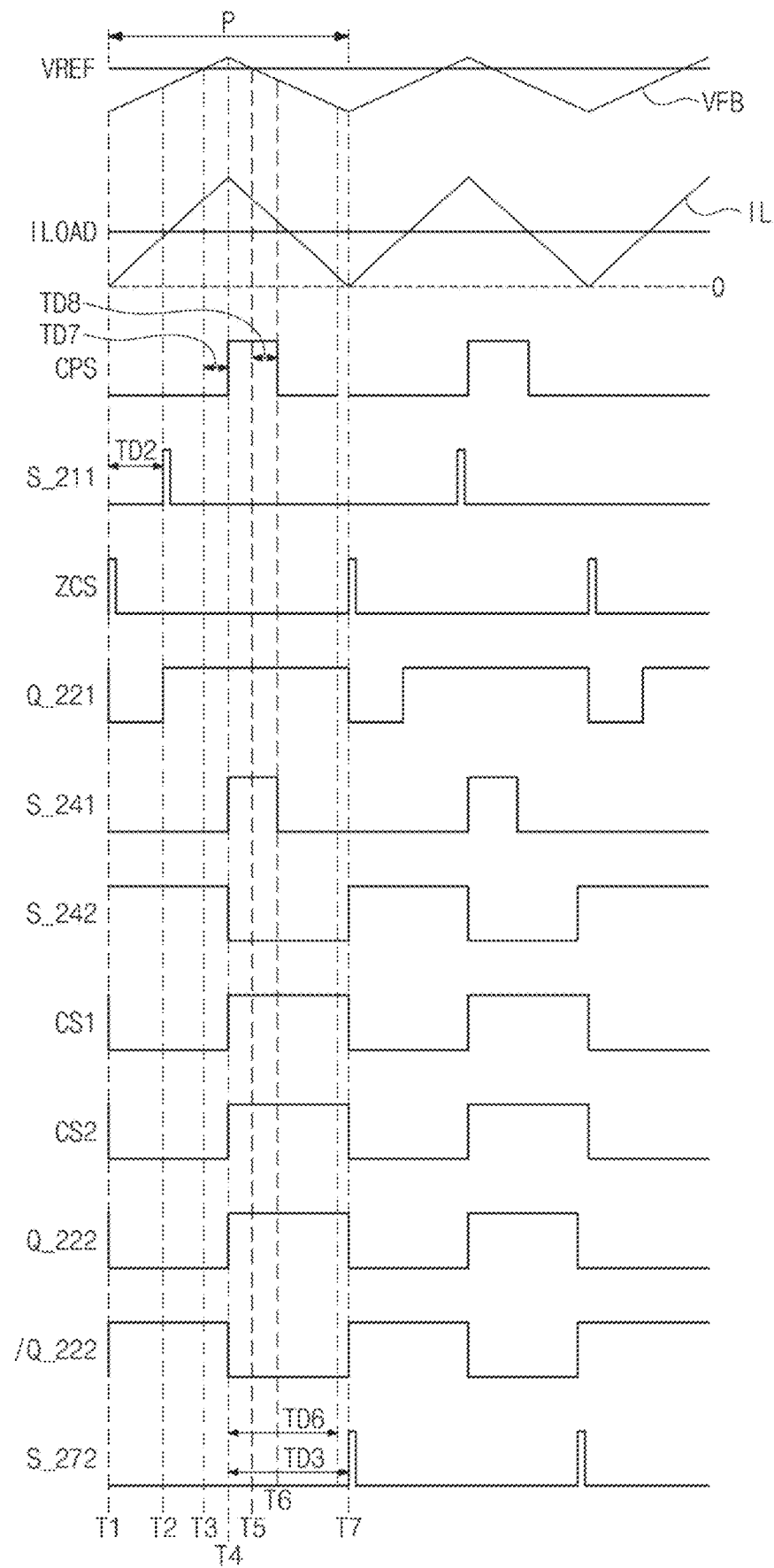
FIG. 12 illustrates an example in which signals of a voltage converter are controlled by a control logic circuit in the process where a control logic circuit enters a PWM mode from a PFM mode.

FIG. 11 illustrates a method in which signals of the control logic circuit 200 are controlled in the process where the control logic circuit 200 enters the PWM mode from the PFM mode. FIG. 12 illustrates an example in which signals of the voltage converter 100 are controlled by the control logic circuit 200 in the process where the control logic circuit 200 enters the PWM mode from the PFM mode.

Referring to FIGS. 1, 11, and 12, a comparison of the feedback voltage VFB and the reference voltage VREF is shown. A comparison of the load current ILOAD and the inductor current IL is shown. A signal S_211 may be an output of the first signal generator 211. A signal Q_221 may be the non-reverse output "Q" of the first flip-flop 221. A signal S_241 may be an output of the first AND gate 241. A signal S_242 may be an output of the second AND gate 242. A signal Q_222 may be the non-reverse output "Q" of the second flip-flop 222. A signal /Q_222 may be the reverse output /Q of the second flip-flop 222. A signal S_272 may be an output of the second pulse generator 272.

In the PFM mode, the mode signal MODE may have the low level "L". Compared to FIG. 6, in some example embodiments, where the load current ILOAD increases to such an extent as not to supply the load current ILOAD sufficiently in the PFM mode, the third time interval may be removed.

At a first time T1, in synchronization with a falling edge of the first control signal CS1, the first pulse generator 271 may output a pulse that transitions from the high level to the low level and then transitions from the low level to the high level. In response to a falling edge of the output pulse of the first pulse generator 271, the non-reverse output Q_221 of the first flip-flop 221 may transition from the high level to the low level.

After the second delay time TD2 (e.g., an on-time) passes from when the first control signal CS1 transitions from the high level to the low level (e.g., from the first time T1), at a second time T2, the first signal generator 211 may transit the output signal S_211 from the low level to the high level.

In response to the output signal S_211 of the first signal generator 211 transitioning from the low level to the high level (e.g., in synchronization with a rising edge thereof), the non-reverse output Q_221 of the first flip-flop 221 may transition from the low level to the high level. Accordingly, the output signal of the first OR gate 231 may also transition from the low level to the high level. Because the comparison signal CPS is at the low level, the output signal S_241 of the first AND gate 241 may maintain the low level.

At a third time T3, the feedback voltage VFB may be greater than the reference voltage VREF. After a seventh delay time TD7 passes from when the feedback voltage VFB is greater than the reference voltage VREF, at a fourth time T4, the comparison signal CPS may transition from the low level to the high level. For example, the seventh delay time TD7 may be an operation delay of the comparator 122. The seventh delay time TD7 may be the same as or similar (for example, within ±10%) to the first delay time TD1 of FIG. 6 or the fourth delay time TD4 or the fifth delay time TD5 of FIG. 9.

In response to the comparison signal CPS transitioning to the high level "H", as marked by operation S31, the output signal S_241 of the first AND gate 241 may transition to the high level "H". The latch 250 may be reset in response to the output signal S_241 of the first AND gate 241 transitioning from the low level to the high level.

In response to the latch 250 being reset, that is, in response to the comparison signal CPS transitioning to the high level "H", as marked by operation S32, the first control signal CS1 may transition to the high level "H". Likewise, as marked by operation S33, the second control signal CS2 may transition to the high level in response to the comparison signal CPS transitioning to the high level "H".

In response to the first control signal CS1 transitioning to the high level, the non-reverse output Q_222 of the second flip-flop 222 may transition from the low level to the high level.

At a fifth time T5, the feedback voltage VFB may be smaller than the reference voltage VREF. After an eighth delay time TD8 passes from when the feedback voltage VFB is smaller than the reference voltage VREF, at a sixth time T6, the comparison signal CPS may transition from the high level to the low level. For example, the eighth delay time TD8 may be an operation delay of the comparator 122. The eighth delay time TD8 may be the same as or similar (for example, within ±10%) to the first delay time TD1 of FIG. 6, the fourth delay time TD4 or the fifth delay time TD5 of FIG. 9, or the seventh delay time TD7 of FIG. 12.

In response to the comparison signal CPS transitioning to the low level "L", as marked by operation S34, the output signal S_241 of the first AND gate 241 may transition to the low level "L". As the output signal S_241 of the first AND gate 241 transitions to the low level, the output signal of the second inverter 262 may transition to the high level.

After the non-reverse output "Q" of the second flip-flop 222 transitions to the high level, for example, as marked by operation S35, after the third delay time TD3 (e.g., an off-time) passes from when the comparison signal CPS transitions to the high level, at a seventh time T7, the output signal of the second signal generator 212 may transition from the low level to the high level.

In response to the output signal of the second signal generator 212 transitioning from the low level to the high level (e.g., in synchronization with a rising edge thereof), the second pulse generator 272 may output a pulse that transitions from the low level to the high level and then transitions from the high level to the low level. That is, as marked by operation S36, after the third delay time TD3 (e.g., an off-time) passes from when the comparison signal CPS transitions to the high level "H", the reverse output /Q of the second flip-flop 222 may transition to the high level "H".

Because the output signal of the second inverter 262 transitions to the high level at the sixth time T6, the output of the second AND gate 242 may transition from the low level to the high level. That is, the latch 250 may be set. That is, as marked by operation S37, after the third delay time TD3 (e.g., an off-time) passes from when the comparison signal CPS transitions to the high level "H", the first control signal CS1 may transition to the low level "L".

Likewise, as marked by operation S38, after the third delay time TD3 (e.g., an off-time) passes from when the comparison signal CPS transitions to the high level "H", the second control signal CS2 may transition to the low level "L".

At the seventh time T7, the inductor current IL may be "0". Accordingly, the zero current sensor 130 may transit the zero current signal ZCS from the low level to the high level. Afterwards, as the inductor current IL increases, the zero current sensor 130 may transit the zero current signal ZCS from the high level to the low level.

In some example embodiments, a delay of an off-time that the second signal generator 212 provides in the PFM mode may correspond to the third delay time TD3. A delay of an off-time that the second signal generator 212 provides in the PWM mode may correspond to the sixth delay time TD6. The third delay time TD3 may be longer than the sixth delay time TD6. A hysteresis may be provided in mode switching of the voltage converter 100 by making a length of the third delay time TD3 and a length of the sixth delay time TD6 different.

For example, when the voltage converter 100 is in the PWM mode, as illustrated in FIG. 9, the voltage converter 100 may control the first control signal CS1 and the second control signal CS2 based on an off-time of the sixth delay time TD6.

Assuming that the voltage converter 100 operates in the PFM mode as illustrated in FIG. 6, as the amount of load current ILOAD increases, lengths of the first and second time intervals of the period "P" may increase, and a length of the third time interval of the period "P" may decrease. In some example embodiments, where lengths of the first and second time intervals increase to such an extent as to cause switching illustrated in FIG. 6 (e.g., switching based on the sixth delay time TD6), the voltage converter 100 may enter the PWM mode.

However, the voltage converter 100 may not enter the PWM mode until lengths of the first and second time intervals further increase to such an extent as to cause switching illustrated in FIG. 12 (e.g., switching based on the third delay time TD3) (e.g., until the load current ILOAD further increases).

That is, a difference between the third delay time TD3 and the sixth delay time TD6 may act as a hysteresis when entering the PWM mode from the PFM mode. Accordingly, an operating mode may be prevented from being changed due to a transient voltage change, noise, or ripple. For example, the occurrence of an operating mode changing due to a transient voltage change, noise or ripple may be reduced or prevented.

Figure 13:
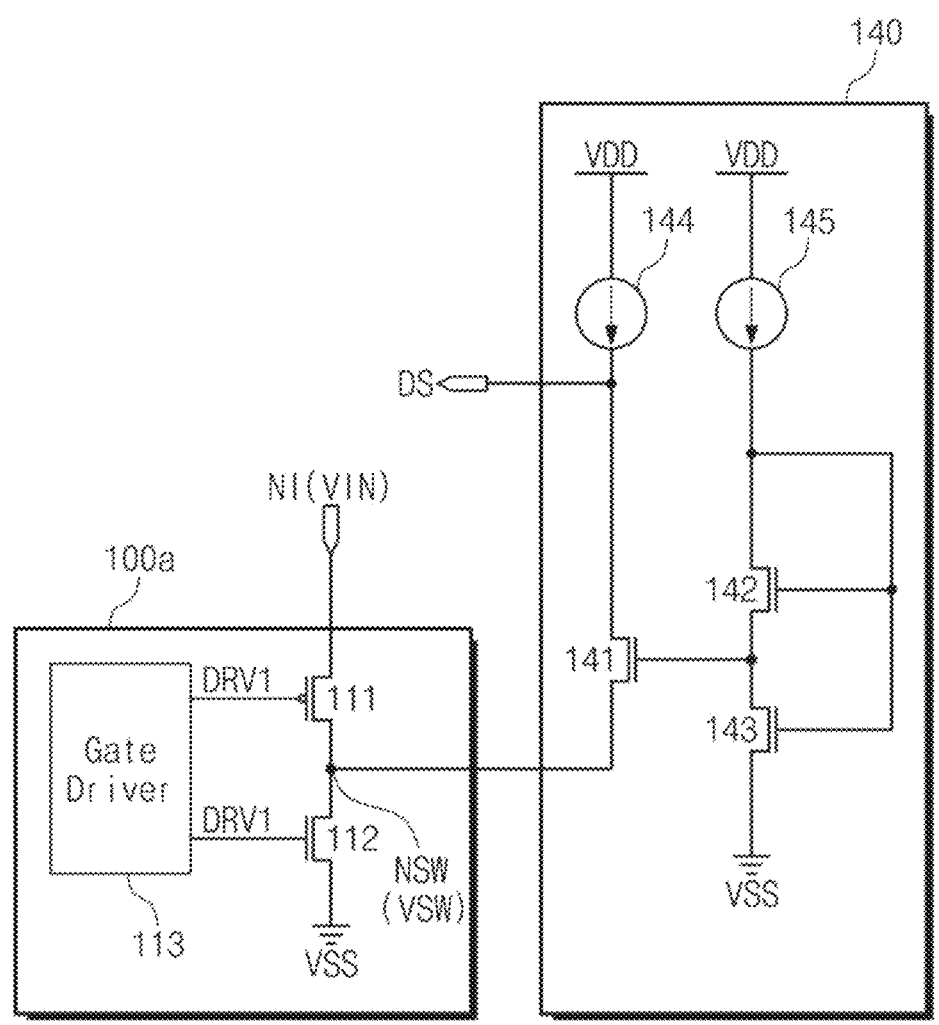
FIG. 13 illustrates a diode sensor and a partial voltage converter associated with the diode sensor.

FIG. 13 illustrates the diode sensor 140 and a partial voltage converter 100a associated with the diode sensor 140. Referring to FIG. 13, the diode sensor 140 may include a first transistor 141, a second transistor 142, a third transistor 143, a first current source 144, and a second current source 145.

The first transistor 141 is connected between (e.g., directly connected between) the switch node NSW and the first current source 144. A gate of the first transistor 141 may be connected with a node between the second transistor 142 and the third transistor 143. A signal of a node between the first transistor 141 and the first current source 144 may be output as the detection signal DS.

The second transistor 142 and the third transistor 143 may be connected between (e.g., directly connected between) the second current source 145 and the ground node to which the ground voltage VSS is supplied. A gate of the second transistor 142 and a gate of the third transistor 143 may be connected with a node between the second transistor 142 and the second current source 145.

The second current source 145, the second transistor 142, and the third transistor 143 may supply a positive voltage, which is smaller (or less) than a threshold voltage of the first transistor 141, to the gate of the first transistor 141. For example, a voltage belonging to a range from 0.2 V to 0.3 V may be supplied to the gate of the first transistor 141.

Figure 14:
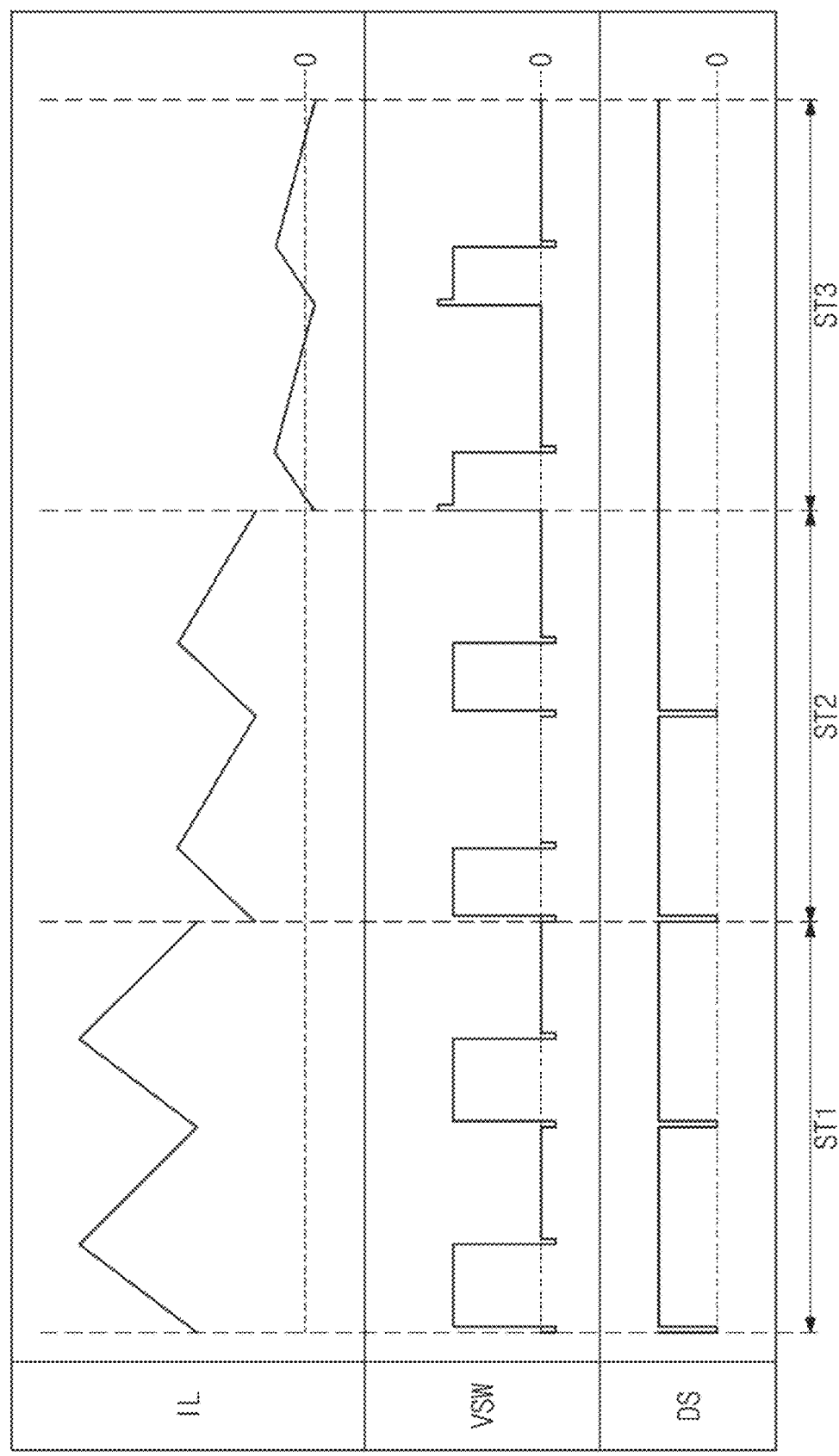
FIG. 14 illustrates examples in which a detection signal is activated.

FIG. 14 illustrates examples in which the detection signal DS is activated. Referring to FIGS. 1, 13, and 14, in a first state ST1, the inductor current IL may have a positive value. The gate driver 113 may control the first drive signal DRV1 and the second drive signal DRV2 so as to have a dead time.

For example, in some example embodiments, when turning on the first power transistor 111 and turning off the second power transistor 112, the gate driver 113 may turn off the first power transistor 111 and may turn on the second power transistor 112 after a given (e.g., desired) time during which both the first power transistor 111 and the second power transistor 112 are turned off.

Likewise, in some example embodiments, when turning off the first power transistor 111 and turning on the second power transistor 112, the gate driver 113 may turn off the first power transistor 111, and may turn on the second power transistor 112 after a given (e.g., desired) time during which both the first power transistor 111 and the second power transistor 112 are turned off.

During the dead time, a waveform of the switch voltage VSW of the switch node NSW may change depending on a direction of the inductor current IL, for example, depending on whether the inductor current IL is a positive current or a negative current.

When the inductor current IL is a positive current, that is, when the inductor current IL flows toward the output node NO from the switch node NSW, during the dead time, the switch voltage VSW may be smaller than the ground voltage VSS for a moment. For example, the switch voltage VSW may be smaller than the ground voltage VSS due to a parasitic diode coming from the second power transistor 112.

When the switch voltage VSW is smaller than the ground voltage VSS, the switch voltage VSW and a gate voltage of the first transistor 141 may exceed a threshold voltage of the first transistor 141. Accordingly, the first transistor 141 may be turned on, and the detection signal DS may transition to the low level.

When the switch voltage VSW is equal to or greater than the ground voltage VSS, the first transistor 141 may be turned off. Accordingly, the detection signal DS may be of the high level.

As the load current ILOAD decreases, as illustrated in a second state ST2, the inductor current IL may decrease. However, the inductor current IL may maintain a positive value even in the second state ST2, and the detection signal DS may periodically transition to the low level and may then be set to the high level.

As the load current ILOAD further decreases, as illustrated in a third state ST3, an interval where the inductor current IL is a negative current may occur. in some example embodiments, where the inductor current IL is a negative current during the dead time, the switch voltage VSW may be greater than a voltage of the high level. For example, because a parasitic diode does not occur at the second power transistor 112, the switch voltage VSW may become a positive voltage.

Figure 15:
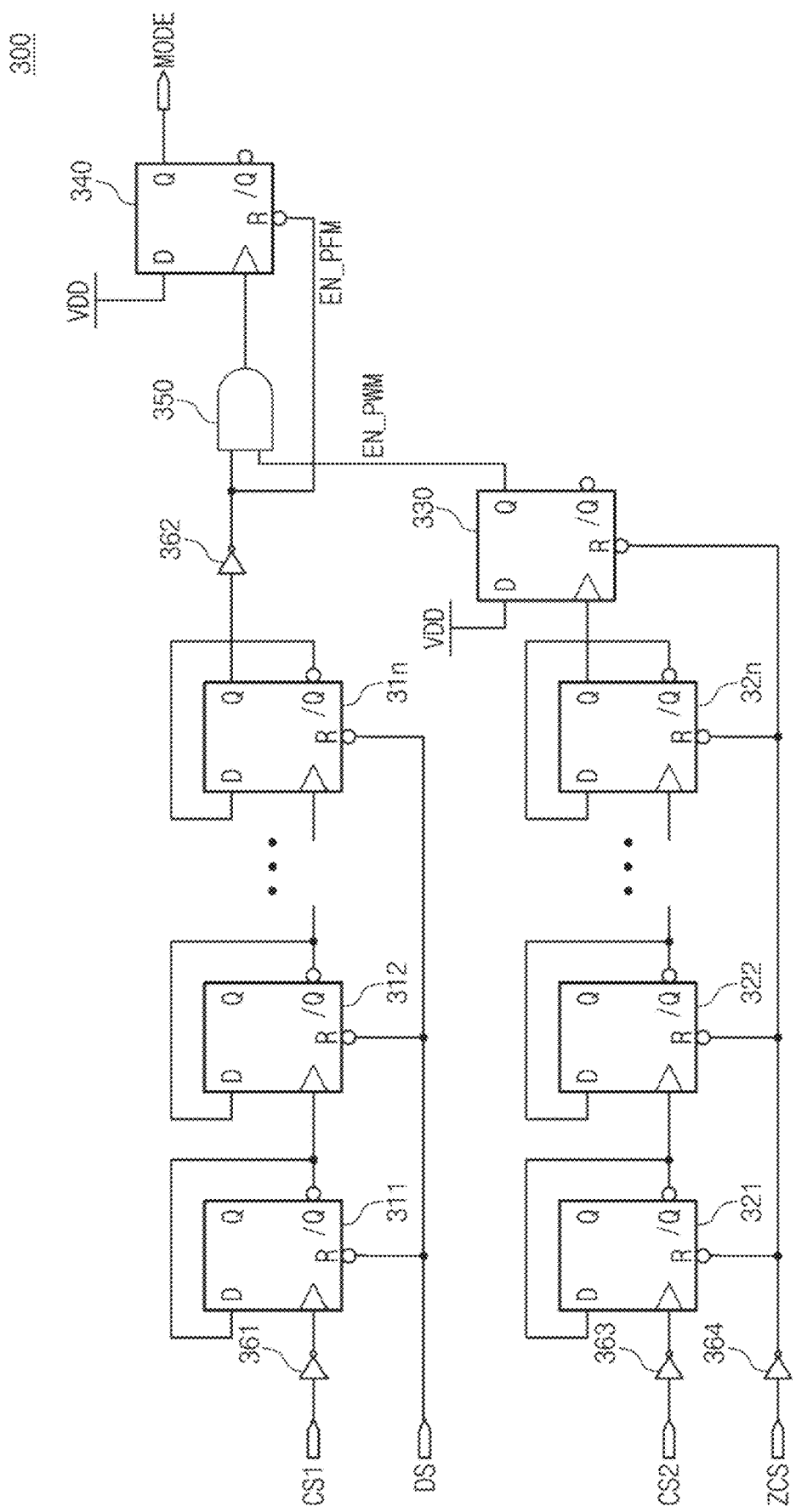
FIG. 15 illustrates a mode control circuit according to some example embodiments of the present disclosure.

FIG. 15 illustrates a mode control circuit 300 according to some example embodiments of the present disclosure. The mode control circuit 300 may correspond to the mode control circuit 150 of FIG. 1. Referring to FIGS. 1 and 15, the mode control circuit 300 may include 11-th to 1n-th flip-flops 311 to 31$n$, 21-th to 2n-th flip-flops 321 to 32$n$ (n being a positive integer), a third flip-flop 330, a fourth flip-flop 340, an AND gate 350, a first inverter 361, a second inverter 362, a third inverter 363, and a fourth inverter 364.

An inverted version of the first control signal CS1 may be transferred to a clock input of the 11-th flip-flop 311 through the first inverter 361. The detection signal DS may be transferred to a reset input "R" of the 11-th flip-flop 311. A reverse output /Q of the 11-th flip-flop 311 may be transferred to a data input "D" of the 11-th flip-flop 311.

A reverse output /Q of the 1(k−1)-th flip-flop 31($k$−1) may be transferred to a clock input of the 1k-th flip-flop 31$k$ (k being a positive integer being more than 1 and equal to or less than n). The detection signal DS may be transferred to a reset input "R" of the 1k-th flip-flop 31$k$. A reverse output /Q of the 1k-th flip-flop 31$k$ may be transferred to a data input "D" of the 1k-th flip-flop 31$k$.

A reverse output /Q of the 1(n−1)-th flip-flop 31($n$−1) may be transferred to a clock input of the 1n-th flip-flop 31$n$. The detection signal DS may be transferred to a reset input "R" of the 1n-th flip-flop 31$n$. A reverse output /Q of the 1n-th flip-flop 31$n$ may be transferred to a data input "D" of the 1n-th flip-flop 31$n$. The non-reverse output "Q" of the 1n-th flip-flop 31$n$ may be transferred to the second inverter 362. An output of the second inverter 362 may be transferred to the AND gate 350 and to the fourth flip-flop 340 as a PFM enable signal EN_PFM.

Operations and configurations of the 21-th to 2n-th flip-flops 321~32$n$ are the same as those of the 11-th to 1n-th flip-flops 311 to 31$n$ except that an inverted version of the zero current signal ZCS is transferred to reset inputs "R" through the fourth inverter 364 and an inverted version of the second control signal CS2 is transferred to a clock input of the 21-th flip-flop 321 through the third inverter 363 Thus, additional description will be omitted to avoid redundancy.

A non-reverse output "Q" of the 2n-th flip-flop 32$n$ may be transferred to a clock input of the third flip-flop 330. An inverted version of the zero current signal ZCS may be transferred to a reset input "R" of the third flip-flop 330 through the fourth inverter 364. The power supply voltage VDD may be transferred to a data input "D" of the third flip-flop 330. A non-reverse output "Q" of the third flip-flop 330 may be transferred to the AND gate 350 as a PWM enable signal EN_PWM.

The AND gate 350 may receive the output signal of the second inverter 362 and the PWM enable signal EN_PWM. An output of the AND gate 350 may be transferred to a clock input of the fourth flip-flop 340. The PFM enable signal EN_PFM may be transferred to a reset input "R" of the fourth flip-flop 340. The power supply voltage VDD may be transferred to a data input "D" of the fourth flip-flop 340. A non-reverse output "Q" of the fourth flip-flop 340 may be the mode signal MODE.

When the detection signal DS is at the high level, the 11-th to 1n-th flip-flops 311 to 31$n$ may be released from a reset state. When the detection signal DS transitions to the low level, the 11-th to 1n-th flip-flops 311 to 31n may be reset at the same time. In the reset state, the reverse output /Q or the data input "D" of each of the 11-th to 1n-th flip-flops 311 to 31n may be set to the high level.

Like the third state ST3 of FIG. 14, when the detection signal DS maintains the high level, the 11-th to 1n-th flip-flops 311 to 31n may be released from a reset state. The 11-th to 1n-th flip-flops 311 to 31n may constitute a divider. A frequency of the 1k-th flip-flop 31k may be $1/(2^k)$ times a frequency of the first control signal CS1. That is, in some example embodiments, where the first control signal CS1 toggles during $2^n$ periods in a state where the detection signal DS maintains the high level, the non-reverse output "Q" of the 1n-th flip-flop 31n may transition from the low level to the high level.

When the non-reverse output "Q" of the 1n-th flip-flop 31n transitions from the low level to the high level, the PFM enable signal EN_PFM may transition from the high level to the low level. Accordingly, the fourth flip-flop 340 may be reset, and the mode signal MODE may be set to the low level.

While the first control signal CS1 toggles, like the first state ST1 or the second state ST2, when the load current ILOAD increases and thus the detection signal DS is set the low level, all the 11-th to 1n-th flip-flops 311 to 31n may be reset. That is, only in some example embodiments, where the detection signal DS is not generated while the first control signal CS1 toggles as much as $2^n$ periods, the voltage converter 100 may enter the PFM mode. The $2^n$ periods may act as a hysteresis.

Likewise, the 21-th to 2n-th flip-flops 321 to 32n may be simultaneously reset in response to the zero current signal ZCS being set to the high level. When the inductor current IL passes "0" like the third state ST3, the zero current signal ZCS may be set to the high level, and the 21-th to 2n-th flip-flops 321 to 32n may be reset.

Like the first state ST1 and the second state ST2, when the inductor current IL does no pass "0", the zero current signal ZCS may maintain the low level. In some example embodiments, where the second control signal CS2 toggles during $2^n$ periods in a state where the zero current signal ZCS maintains the low level, the non-reverse output "Q" of the 2n-th flip-flop 32n may transition from the low level to the high level.

In response to the non-reverse output "Q" of the 2n-th flip-flop 32n transitioning to the high level, the non-reverse output "Q" of the third flip-flop 330, that is, the PWM enable signal EN_PWM may transition from the low level to the high level.

When the PFM enable signal EN_PFM is in a disable state of the high level and the PWM enable signal EN_PWM is in an enable state of the high level, an output of the AND gate 350 may transition from the low level to the high level. In response to the output of the AND gate 350 transitioning to the high level, the fourth flip-flop 340 may output the mode signal MODE of the high level.

While the second control signal CS2 toggles, like the third state ST3, when the load current ILOAD decreases and thus the zero current signal ZCS is set the high level, all the 21-th to 2n-th flip-flops 321 to 32n may be reset. That is, only in some example embodiments, where the zero current signal ZCS is not generated while the second control signal CS2 toggles as much as $2^n$ periods, the voltage converter 100 may enter the PWM mode. The $2^n$ periods may act as a hysteresis.

For example, even though the detection signal DS is deactivated to the high level and thus a condition for entering the PFM mode is satisfied, in some example embodiments, where a condition for entering the PFM mode is not maintained during $2^n$ periods, the mode control circuit 300 may maintain a current mode. Likewise, even though the zero current signal ZCS is deactivated to the low level and thus a condition for entering the PWM mode is satisfied, in some example embodiments, where a condition for entering the PWM mode is not maintained during $2^n$ periods, the mode control circuit 300 may maintain a current mode.

Figure 16:
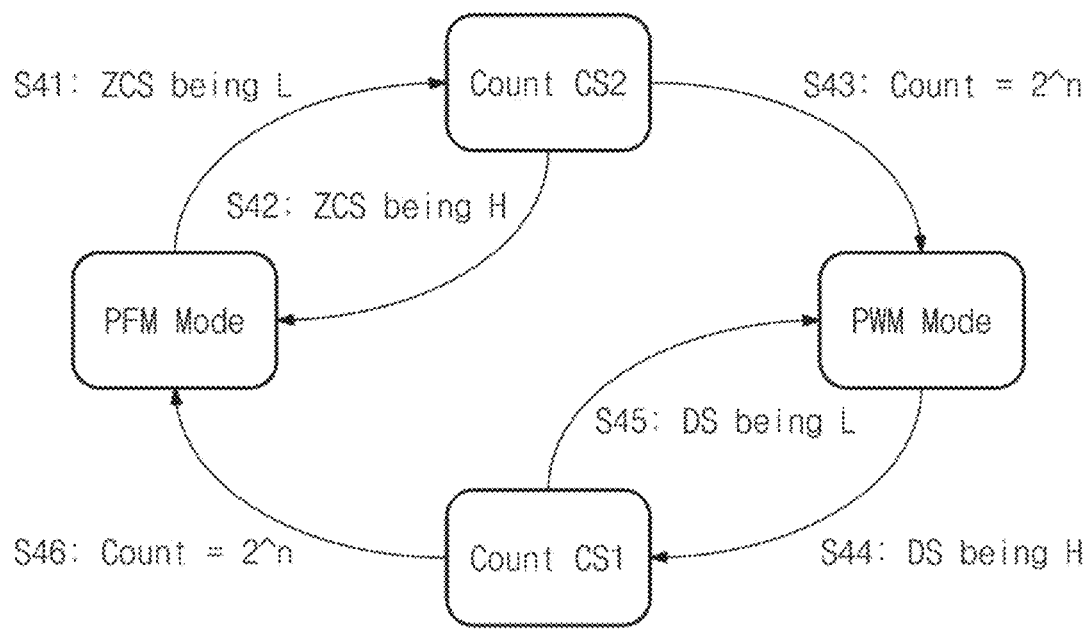
FIG. 16 illustrates a state diagram of a mode control circuit.

FIG. 16 illustrates a state diagram of the mode control circuit 150. Referring to FIGS. 1 and 16, the mode control circuit 150 may select the PFM mode. When the zero current signal ZCS is set to the low level, in operation S41, the mode control circuit 150 may count periods of the second control signal CS2. When the zero current signal ZCS transitions to the high level "H" while counting, in operation S42, the mode control circuit 150 may reset a count and may maintain the PFM mode.

When a result of counting periods of the second control signal CS2 indicates $2^n$ while counting, in operation S43, the mode control circuit 150 may select the PWM mode. When the detection signal DS is set to the high level "H", in operation S44, the mode control circuit 150 may count periods of the first control signal CS1. When the detection signal DS transitions to the low level "L" while counting, in operation S45, the mode control circuit 150 may reset a count and may maintain the PWM mode.

When a result of counting periods of the first control signal CS1 indicates $2^n$ while counting, in operation S46, the mode control circuit 150 may select the PFM mode.

Figure 17:
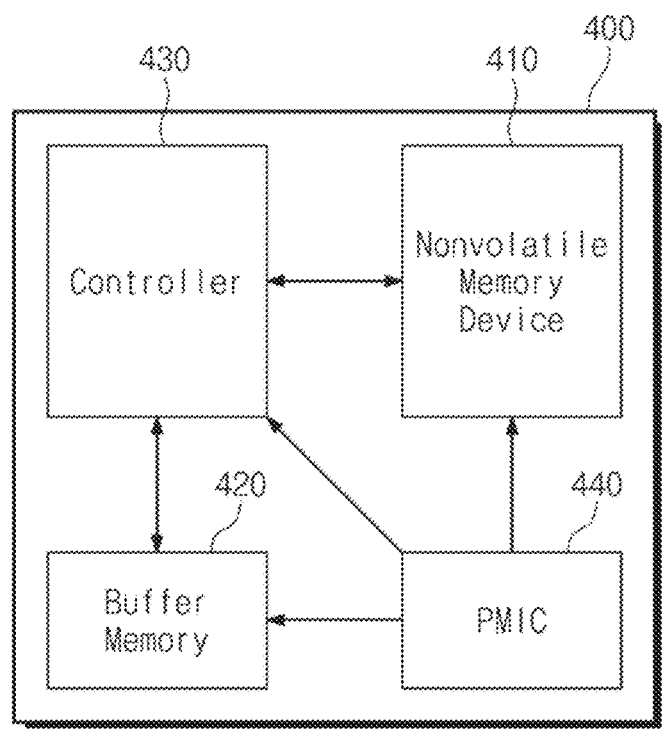
FIG. 17 illustrates an electronic device according to some example embodiments of the present disclosure.

FIG. 17 illustrates an electronic device 400 according to some example embodiments of the present disclosure. For example, the electronic device 400 may be a storage device. Referring to FIG. 17, the electronic device 400 may include a nonvolatile memory device 410, a buffer memory 420, a controller 430, and a power management integrated circuit (PMIC) 440.

The nonvolatile memory device 410 may include at least one of various nonvolatile memory devices such as a flash memory device, a phase change memory device, a ferroelectric memory device, a magnetic memory device, and a resistive memory device.

The buffer memory 420 may include at least one of various random access memories such as a dynamic random access memory (DRAM), a static RAM, a phase-change RAM, a ferroelectric RAM, a magnetic RAM, and a resistive RAM.

The controller 430 may operate under control of an external host device. The controller 430 may provide the external host device with at least a portion of a storage space of the nonvolatile memory device 410. The controller 430 may use the buffer memory 420 for various purposes, for example, as a working memory for storing metadata or codes, a cache memory between a nonvolatile memory device and an external host device, or a buffer memory.

The PMIC 440 may supply a power to the nonvolatile memory device 410, the buffer memory 420, and the controller 430. In some example embodiments, the PMIC 440 may include the voltage converter 100 according to some example embodiments of the present disclosure. The PMIC 440 may supply a power to the nonvolatile memory device 410, the buffer memory 420, and the controller 430 in the PFM mode or the PWM mode.

The PMIC 440 may select one of the PFM mode and the PWM mode depending on the amount of load current that is used in the nonvolatile memory device 410, the buffer memory 420, and the controller 430. Accordingly, the power efficiency of the electronic device 400 may be improved.

In the above embodiments, components according to the present disclosure are described by using the terms "first", "second", "third", and the like. However, the terms "first", "second", "third", and the like may be used to distinguish components from each other and do not limit the present disclosure. For example, the terms "first", "second", "third", and the like do not involve an order or a numerical meaning of any form.

In the above example embodiments, components according to example embodiments of the present disclosure are described by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

It will be understood that some or all of any of the devices, controllers, generators, decoders, units, modules, or the like according to any of the example embodiments as described herein, any combination thereof, or the like may be included in, may include, and/or may be implemented by one or more instances of processing circuitry such as hardware including logic circuits, a hardware/software combination such as a processor executing software; or a combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory units, or the like as described herein may include a non-transitory computer readable storage device, for example a solid state drive (SSD), storing a program of instructions, and the one or more instances of processing circuitry may be configured to execute the program of instructions to implement the functionality of some or all of any of the devices, controllers, decoders, units, modules, or the like according to any of the example embodiments as described herein, including any of the methods of operating any of same as described herein.

According to the present disclosure, a voltage converter may operate in a pulse frequency modulation mode and a pulse width modulation mode depending on the amount of load current. Accordingly, voltage converters having improved power efficiency, storage devices including the voltage converter, and operating methods of the voltage converter are provided.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. An operating method of a voltage converter, the method comprising:

converting an input voltage to an output voltage and providing a load current corresponding to the output voltage in one of a pulse frequency modulation mode and a pulse width modulation mode;

entering the pulse frequency modulation mode in response to an amount of the load current being less than or equal to a first threshold value; and entering the pulse width modulation mode in response to the amount of the load current being greater than a second threshold value, wherein, in the pulse frequency modulation mode, the load current is provided based on a first time delay, the first time delay being based on a first comparison of the input voltage and the output voltage with a switching frequency, and wherein, in the pulse width modulation mode, the load current is provided based on a second time delay, the second time delay being based on a second comparison of the input voltage and the output voltage with the switching frequency.

2. The method of claim 1, wherein the voltage converter includes a first power transistor and a second power transistor, which are connected with a switch node and are configured to provide the load current, and wherein the first power transistor and the second power transistor are controlled based on a period.

3. The method of claim 2, wherein the providing of the load current in the pulse frequency modulation mode includes:

during a first time interval of the period, turning on the first power transistor and turning off the second power transistor;

during a second time interval of the period, turning on the second power transistor and turning off the first power transistor, the first time interval corresponding to the first time delay; and during a third time interval of the period, turning off the first power transistor and the second power transistor.

4. The method of claim 3, wherein the first time interval is executed in response to a feedback voltage associated with the output voltage being less than a reference voltage.

5. The method of claim 4, wherein the feedback voltage is generated by dividing the output voltage.

6. The method of claim 3, wherein the second time interval is executed in response to an on-time passing after a feedback voltage associated with the output voltage being less than a reference voltage.

7. The method of claim 3, wherein the third time interval is executed in response to an amount of a current flowing through the switch node being "0".

8. The method of claim 3, wherein the providing of the load current in the pulse frequency modulation mode further includes:

performing pulse frequency modulation for adjusting a length of the period by adjusting a length of the third time interval based on the amount of the load current.

9. The method of claim 2, wherein the providing of the load current in the pulse width modulation mode includes:

during a first time interval of the period, turning off the first power transistor and turning on the second power transistor; and during a second time interval of the period, turning on the first power transistor and turning off the second power transistor, the second time interval corresponding to the second time delay.

10. The method of claim 9, wherein the first time interval is executed in response to a feedback voltage associated with the output voltage being greater than a reference voltage.

11. The method of claim 9, wherein the second time interval is executed in response to an off-time passes after a feedback voltage associated with the output voltage being greater than a reference voltage.

12. The method of claim 9, wherein the providing of the load current in the pulse width modulation mode further includes:
performing pulse width modulation by adjusting a ratio of the first time interval and the second time interval of the period based on a feedback voltage associated with the output voltage.

13. The method of claim 2, wherein the voltage converter further includes an inductor connected between the switch node and an output node from which the output voltage is output, and
wherein, during a dead time the first power transistor and the second power transistor are turned off, determining whether the amount of the load current is less than or equal to the first threshold value in response to a current flowing from the inductor to the switch node.

14. The method of claim 13, wherein the entering of the pulse frequency modulation mode includes:
entering the pulse frequency modulation mode in response to there being determined, as much as a specific count, that the amount of the load current is less than or equal to the first threshold value.

15. A voltage converter comprising:
a first transistor connected between an input node and a switch node;
a second transistor connected between the switch node and a ground node;
an inductor connected between the switch node and an output node;
a capacitor connected between the output node and the ground node;
resistors connected with the output node, and configured to divide an output voltage of the output node to generate a feedback voltage;
a comparator configured to compare the feedback voltage and a reference voltage to output a comparison signal;
a mode control circuit configured to output a mode signal of a first level based on an amount of a load current supplied through the output node being less than or equal to a threshold and to output the mode signal of a second level based on the amount of the load current being greater than the threshold;
a control logic circuit configured to generate a first control signal and a second control signal based on pulse frequency modulation based on the mode signal being at the first level and to generate the first control signal and the second control signal based on pulse width modulation based on the mode signal being at the second level; and
a gate driver configured to control the first transistor and the second transistor in response to the first control signal and the second control signal.

16. The voltage converter of claim 15, further comprising:
a first sensor configured to output a zero current signal in response to an amount of a current flowing through the switch node being "0"; and
a second sensor configured to output a detection signal in response to a current flowing from the switch node to the inductor during a dead time of the first transistor and the second transistor,
wherein the mode control circuit generates the mode signal based on the zero current signal, the detection signal, the first control signal, and the second control signal, and
wherein the control logic circuit generates the first control signal and the second control signal in response to the zero current signal.

17. The voltage converter of claim 16, wherein, based on the mode signal being at the first level, the control logic circuit is configured to:
control the first control signal and the second control signal such that the first transistor is turned on and the second transistor is turned off, in response to the comparison signal indicating that the feedback voltage is less than the reference voltage;
control the first control signal and the second control signal such that the first transistor is turned off and the second transistor is turned on, in response to an on-time passing after the comparison signal indicating that the feedback voltage is less than the reference voltage; and
control the first control signal and the second control signal such that the first transistor and the second transistor are turned off, in response to the zero current signal.

18. The voltage converter of claim 16, wherein, based on the mode signal being at the second level, the control logic circuit is configured to:
control the first control signal and the second control signal such that the first transistor is turned off and the second transistor is turned on, in response to the comparison signal indicating that the feedback voltage is greater than the reference voltage; and
control the first control signal and the second control signal such that the first transistor is turned on and the second transistor is turned off, in response to an off-time passing after the comparison signal indicating that the feedback voltage is greater than the reference voltage.

19. The voltage converter of claim 16, wherein the second sensor includes:
a first current source;
a second current source;
a first transistor connected between the first current source and the switch node; and
a second transistor and a third transistor connected between the second current source and the ground node,
wherein a gate of the first transistor is connected between the second transistor and the third transistor, and
wherein a gate of the second transistor and a gate of the third transistor are connected between the second transistor and the second current source.

20. A storage device comprising:
a nonvolatile memory device;
a controller configured to control the nonvolatile memory device; and
a power management integrated circuit configured to supply an output voltage to the nonvolatile memory device and the controller,
wherein the power management integrated circuit includes:
a first transistor connected between an input node and a switch node;
a second transistor connected between the switch node and a ground node;
an inductor connected between the switch node and an output node from which the output voltage is output;

a capacitor connected between the output node and the ground node;

resistors connected with the output node, and configured to divide the output voltage to generate a feedback voltage;

a mode control circuit configured to output a mode signal of a first level based on an amount of a load current being supplied through the output node is greater than a threshold and to output the mode signal of a second level based on the amount of the load current being less than or equal to the threshold;

a control logic circuit configured to generate a first control signal and a second control signal based on pulse frequency modulation based on the mode signal being at the first level and to generate the first control signal and the second control signal based on pulse width modulation based on the mode signal being at the second level; and a gate driver configured to control the first transistor and the second transistor in response to the first control signal and the second control signal.

* * * * *